(12) United States Patent
Grip

(10) Patent No.: US 10,621,293 B2
(45) Date of Patent: Apr. 14, 2020

(54) MODELING HOLES AND FASTENERS FOR FINITE ELEMENT ANALYSIS

(71) Applicant: THE BOEING COMPANY, Chicago, IL (US)

(72) Inventor: Robert Erik Grip, Rancho Palos Verdes, CA (US)

(73) Assignee: THE BOEING COMPANY, Chicago, IL (US)

( * ) Notice: Subject to any disclaimer, the term of this patent is extended or adjusted under 35 U.S.C. 154(b) by 617 days.

(21) Appl. No.: 14/734,732

(22) Filed: Jun. 9, 2015

(65) Prior Publication Data

US 2016/0364512 A1 Dec. 15, 2016

(51) Int. Cl.
*G06F 17/50* (2006.01)

(52) U.S. Cl.
CPC ................................ *G06F 17/5018* (2013.01)

(58) Field of Classification Search
CPC .................................................. G06F 17/5018
See application file for complete search history.

(56) References Cited

U.S. PATENT DOCUMENTS

| | | | | |
|---|---|---|---|---|
| 5,920,491 A * | 7/1999 | Hibbitt | ................ | G06F 17/5018 700/97 |
| 5,956,500 A * | 9/1999 | Shimmell | ........... | G06F 17/5018 703/2 |
| 6,042,315 A * | 3/2000 | Miller | ..................... | F16B 19/00 411/383 |
| 6,697,770 B1 * | 2/2004 | Nagetgaal | ........... | G06F 17/5018 345/423 |
| 7,499,845 B1 * | 3/2009 | Quincy | ............... | G06F 17/5018 703/7 |
| 2006/0080069 A1 * | 4/2006 | Fujimoto | ............ | G06F 17/5018 703/2 |
| 2010/0076739 A1 * | 3/2010 | Hallquist | ............ | G06F 17/5018 703/8 |
| 2012/0226482 A1 * | 9/2012 | Wu | ...................... | G06F 17/5018 703/2 |
| 2014/0298635 A1 * | 10/2014 | Grip | ......................... | F16B 5/02 29/428 |
| 2015/0243077 A1 * | 8/2015 | Grip | ....................... | G06T 17/20 345/423 |

OTHER PUBLICATIONS

Brian D. Foster, A novel Finite Element for Modeling a Fastener in a Lap Joint Assembly, Dec. 2014, Thesis, Wichita State University, p. 1-149.*

(Continued)

*Primary Examiner* — Rehana Perveen
*Assistant Examiner* — Chuen-Meei Gan
(74) *Attorney, Agent, or Firm* — Patterson + Sheridan, LLP

(57) ABSTRACT

Method and computer program product for generating a finite element model of a fastener passing through holes in load-bearing plates. Disks of finite elements are arranged in the holes to model the portions of the fastener aligned with each hole. Fence elements extend about the perimeters of the disks and the perimeters of the holes in directions away from sides of the disks and load-bearing plates. Contact bodies can be arranged on the fence elements. When a finite element model is executed, the fence elements and contact bodies can bear against each other to model contact between the holes and the fastener.

28 Claims, 16 Drawing Sheets

(56) References Cited

OTHER PUBLICATIONS

Gregory A. Shoales et al, E-8/B-707 Wing Station 320 Transition Fir Fastener Finite Element Analysis, Mar. 2004, US Air Force Academy Colorado 80840, p. 1-51.*

McCarthy et al, Three-dimensional finite elemet analysis of single-bolt, single lap composite bolted joints: part 1—model development and validation, Composite Structure 71 (2005) 140-158. Nov. 5, 2004.*

McCarthy et al, Three-dimensional finite elemet analysis of single-bolt, single lap composite bolted joints: part 2—effects of bolt-hole clearance, Composite Structure 71 (2005) 159-175, Nov. 11, 2004.*

Ramin M. Rafatpanah, Finite Element Analysis of a Three-dimensional threaded structure fastener, Rensselaer Polytechinic Institute, p. 1-32, May 2013.*

Alexander Rutman et al, Fastener Modeling for Joining Parts modeled by Shell and Solid elements, 2007 Americas Virtual Product Development COnference Oct. 11-12, 2007, p. 1-26.*

R H Oskouei, MKeikhosravy, and C Soutis, Estimating clamping pressure distribution and stiffness in aircraft bolted joints by finite-element analysis, Proc. IMechE vol. 223 Part G: J. Aerospace Engineering, publication on Jun. 2, 2009. (Year: 2009).*

Farzad Ghods, Finite Element Modeling of Single Shear Fastener Joint Specimens: A Study of Clamp-Up, Friction and Plasticity Effects, Thesis to the Department of Aerospace Engineering and the faculty of the Graduate School of Wichita State University (Year: 2011).*

McCarthy, M. A., and C. T. McCarthy. "Finite element analysis of effects of clearance on single shear composite bolted joints." Plastics, rubber and composites 32, No. 2 (2003): 65-70. (Year: 2003).*

Naik, R. A., and J. H. Rews. "Stress analysis method for a clearance-fit bolt under bearing loads." AIAA journal 24, No. 8 (1986): 1348-1353. (Year: 1986).*

U.S. Appl. No. 14/189,087, entitled Two-Dimensional Model of Triangular Sectors for Use in Generating a Mesh for Finite Element Analysis, filed Feb. 25, 2014.

* cited by examiner

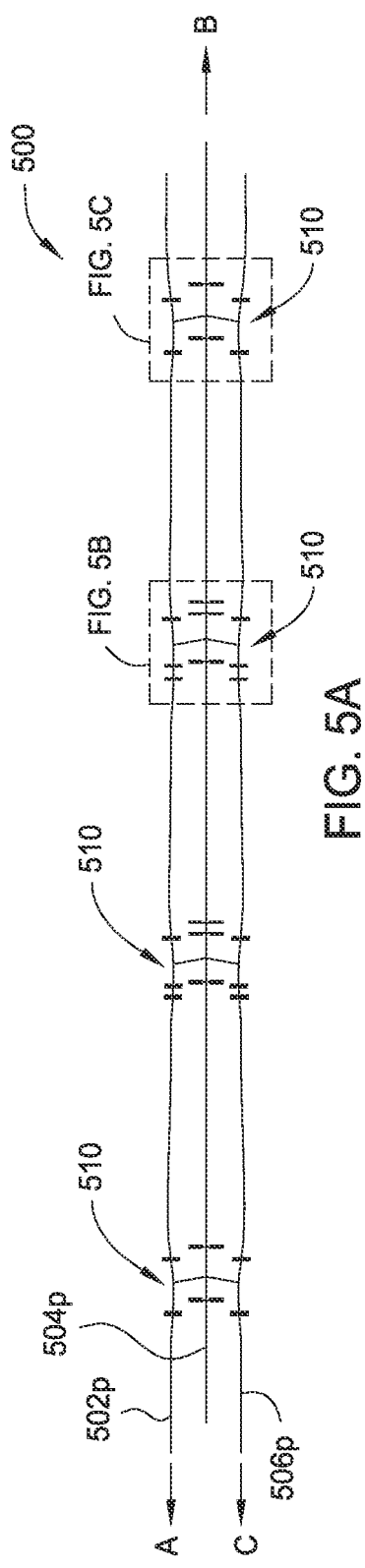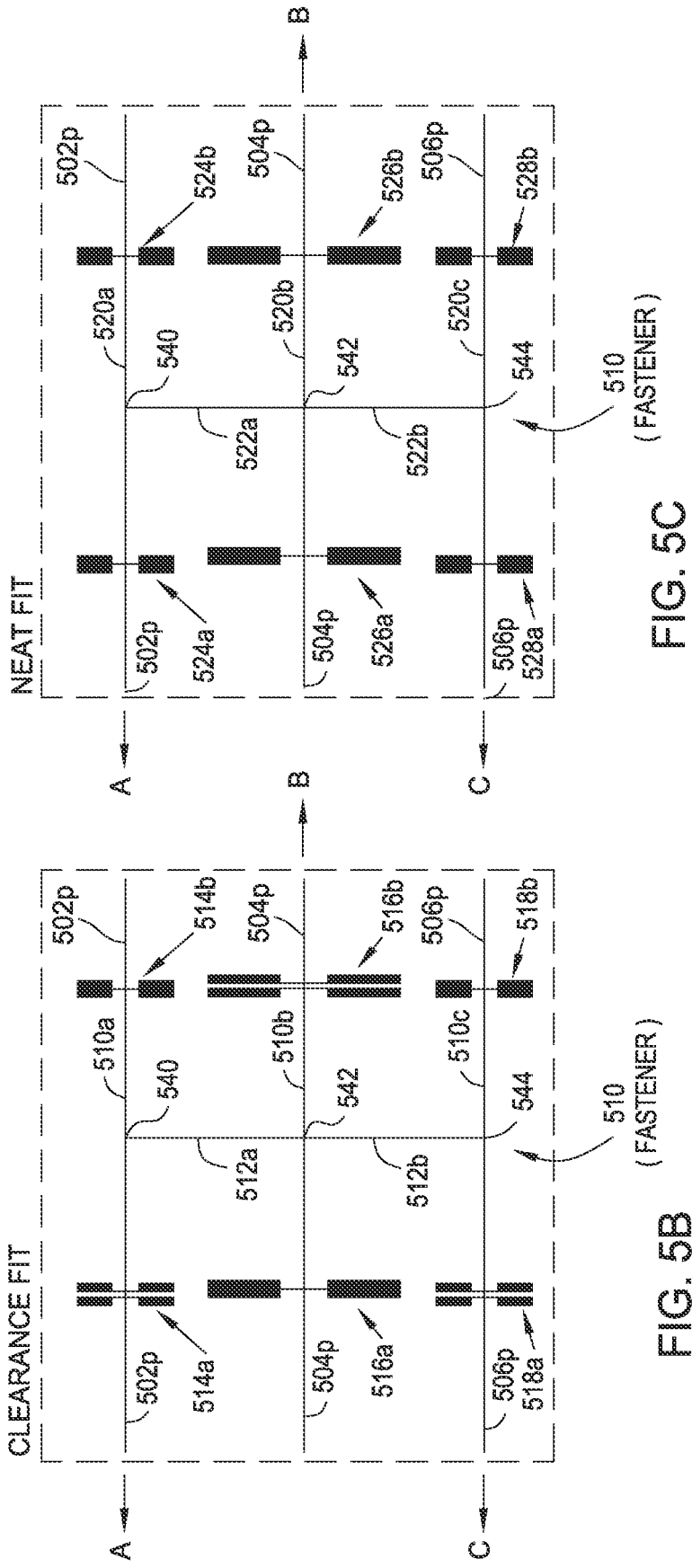

MODELING HOLES AND FASTENERS FOR FINITE ELEMENT ANALYSIS

BACKGROUND

Aspects described herein relate to finite element analysis, and more specifically, to a method for modeling fastener clearance holes.

Finite element modeling of fastener holes (e.g., bolt holes) is a tradeoff between accurate modeling and modeling that is simple enough to allow for acceptable computation times. Complicated models that model the fasteners in detail using finite elements can provide accurate results, but can also require too much computation time to solve. Simplified models have been developed to model fastener holes in plates and the fasteners passing there through. However, while such simplified models can reduce computation time to acceptable times, the resulting computed stresses proximate to the fastener holes can be inaccurate. Among other things, in some circumstances, the simplified models do not accurately model interactions between the fasteners and edges of the fastener holes in the plates. What is needed is a simplified finite element model that reduces the computation time but preserves at least some of the accuracy of the more complicated model.

SUMMARY

A finite element model of a bolted joint fastening at least two plates, implemented in a finite element analysis computer modeling system, according to at least one aspect, includes at least two plate models having interior edges defining through holes having collinear hole axes. The holes include plate fence elements arranged as hollow cylinders concentrically relative to the interior edges. The plate fence elements have a high degree of stiffness in a direction parallel to the hole axes and a low degree of stiffness in a perpendicular direction parallel to the interior edges. The finite element model also includes at least one bolt shank modeled as a beam element with a shank axis. The finite element model also includes at least two bolt disk models corresponding to the at least two plate models. The bolt disk models model a bearing stiffness of the bolt. The bolt disk models have exterior edges. The bolt disk models include bolt fence elements arranged as hollow cylinders concentrically relative to the exterior edges. The bolt fence elements have a high degree of stiffness in a direction parallel to the shank axis and a low degree of stiffness in a perpendicular direction parallel to the exterior edges. The at least two bolt disk models are attached to ends of the at least one bolt shank.

A finite element model of a bolted joint fastening at least three plates, implemented in a finite element analysis computer modeling system, according to at least one aspect, includes at least three plate models having interior edges defining through holes having collinear hole axes. The holes include plate fence elements arranged as hollow cylinders concentrically relative to the interior edges. The plate fence elements have a high degree of stiffness in a direction parallel to the hole axes and a low degree of stiffness in a perpendicular direction parallel to the interior edges. The finite element model also includes at least one bolt shank modeled as a beam element with a shank axis. The finite element model also includes at least three bolt disk models corresponding to the at least two plate models. The bolt disk models model a bearing stiffness of the bolt. The bolt disk models have exterior edges. The bolt disk models include bolt fence elements arranged as hollow cylinders concentrically relative to the exterior edges. The bolt fence elements have a high degree of stiffness in a perpendicular direction parallel to the shank axis and a low degree of stiffness in a direction parallel to the exterior edges. The at least two bolt disk models are attached to ends of the at least one bolt shank.

A computer-implemented method according to at least one aspect includes modeling a first load-bearing plate with a plurality of finite elements. The finite elements of the first load-bearing plate lie in a first plane. The first load-bearing plate includes a first side and a second side opposite the first side. The first load-bearing plate defines a first hole therein. The method includes adding a first plurality of fence elements to the model of the first load-bearing plate that extend away from the first plane on the first side of the load-bearing plate and the second side of the load-bearing plate about a perimeter of the first hole. The method includes modeling a second load-bearing plate with a plurality of finite elements. The finite elements of the second load-bearing plate lie in a second plane. The second load-bearing plate includes a third side and a fourth side opposite the first side. The second load-bearing plate defines a second hole therein. The method includes adding a second plurality of fence elements to the model of the second load-bearing plate that extend away from the second plane on the third side of the load-bearing plate and the fourth side of the load-bearing plate about a perimeter of the second hole. The method includes modeling a fastener passing through the first hole and the second hole. The method models the fastener by modeling a first disk of the fastener with a plurality of finite elements that is substantially aligned with the first load-bearing plate. The first disk includes a fifth side and a sixth side opposite the fifth side. The method also models the fastener by adding a third plurality of fence elements to the model of the first disk that extend away from the first plane on the fifth side of the first disk and the sixth side of the first disk about a perimeter of the first disk. The method also models the fastener by modeling a second disk of the fastener with a plurality of finite elements that is substantially aligned with the second load-bearing plate. The second disk includes a seventh side and an eighth side opposite the seventh side. The method also models the fastener by adding a fourth plurality of fence elements to the model of the second disk that extend away from the second plane on the seventh side of the first disk and the eighth side of the first disk about a perimeter of the second disk. The method also models the fastener by adding a beam element that is connected to the first and the second disk.

At least one aspect includes a computer program product for modeling fastener holes. The computer program product includes a computer-readable storage medium having computer-readable program code embodied therewith. The computer-readable program code is executable by one or more computer processors to model a first load-bearing plate with a plurality of finite elements. The finite elements of the first load-bearing plate lie in a first plane. The first load-bearing plate includes a first side and a second side opposite the first side. The first load-bearing plate defines a first hole therein. The computer-readable program code is also executable to add a first plurality of fence elements to the model of the first load-bearing plate that extend away from the first plane on the first side of the load-bearing plate and the second side of the load-bearing plate about a perimeter of the first hole. The computer-readable program code is also executable to model a second load-bearing plate with a plurality of finite elements. The finite elements of the second load-bearing plate lie in a second plane. The second load-bearing plate includes a third side and a fourth side opposite the first side. The second load-bearing plate defines a second hole therein. The computer-readable program code is also executable to add a second plurality of fence elements to the model of the second load-bearing plate that extend away from second plane on the third side of the load-bearing plate and the fourth side of the load-bearing plate about a perimeter of the second hole. The computer-readable program code is also executable to model a fastener passing through the first hole and the second hole. To model the fastener, the computer-readable program code is executable to model a first disk of the fastener with a plurality of finite elements that is substantially aligned with the first load-bearing plate. The first disk includes a fifth side and a sixth side opposite the fifth side. To model the fastener, the computer-readable program code is executable to add a third plurality of fence elements to the model of the first disk that extend away from the first plane on the fifth side of the first disk and the sixth side of the first disk about a perimeter of the first disk. To model the fastener, the computer-readable program code is executable to model a second disk of the fastener with a plurality of finite elements that is substantially aligned with the second load-bearing plate. The second disk includes a seventh side and an eighth side opposite the seventh side. To model the fastener, the computer-readable program code is executable to add a fourth plurality of fence elements to the model of the second disk that extend away from the second plane on the seventh side of the first disk and the eighth side of the first disk about a perimeter of the second disk. To model the fastener, the computer-readable program code is executable to add a beam element that is connected to the first and the second disk.

At least one aspect includes a computer program product for modeling fastener holes. The computer program product includes a computer-readable storage medium having computer-readable program code embodied therewith. The computer-readable program code is executable by one or more computer processors to receive a finite element model of a first load-bearing plate. The finite elements of the first load-bearing plate lie in a first plane. The finite element model of the load-bearing plate defines a first hole that has a first plurality of nodes about a perimeter of the first hole. The finite element model of the load-bearing plate identifies a first thickness of the first load-bearing plate. The computer-readable program code is also executable to receive a finite element model of a second load-bearing plate. The finite elements of the second load-bearing plate lie in a second plane. The finite element model of the second load-bearing plate defines a second hole that has a second plurality of nodes about a perimeter of the second hole. The finite element model of the second load-bearing plate identifies a second thickness of the second load-bearing plate. The computer-readable program code is also executable to receive characteristics for a fastener to be inserted through the first hole in the first load-bearing plate and the second hole in the second load-bearing plate. The received characteristics for the fastener include material properties of the fastener and a cross-sectional profile of the fastener. The computer-readable program code is also executable to add a first plurality of fence elements to the finite element model of the first load-bearing plate that extend away from the first plane a first side of the load-bearing plate and a second side of the load-bearing plate about the perimeter of the first hole. The fence elements of the first plurality of fence elements are arranged between nodes of the first plurality of nodes. The computer-readable program code is also executable to add a second plurality of fence elements to the finite element model of the second load-bearing plate that extend away from the second plane on a third side of the load-bearing plate and the fourth side of the load-bearing plate about the perimeter of the second hole. The fence elements of the second plurality of fence elements are arranged between nodes of the second plurality of nodes. The computer-readable program code is also executable to generate a finite element model of a first disk within the first hole and in the first plane. A cross-sectional profile of the first disk is equal to the received cross-sectional profile of the fastener. A thickness characteristic of finite elements of the first disk is equal to the identified thickness of the first load-bearing plate. The finite element model of the first disk includes a third plurality of nodes about a perimeter of the first disk. The computer-readable program code is also executable to generate a finite element model of a second disk within the second hole and in the second plane. A cross-sectional profile of the second disk is equal to the received cross-sectional profile of the fastener. A thickness characteristic of finite elements of the second disk is equal to the identified thickness of the second load-bearing plate. The finite element model of the second disk includes a fourth plurality of nodes about a perimeter of the second disk. The computer-readable program code is also executable to add a third plurality of fence elements to the finite element model of the first disk that extend away from the first plane on a fifth side of the first disk and a sixth side of the first disk about the perimeter of the first disk. The fence elements of the third plurality of fence elements are arranged between nodes of the third plurality of nodes. The computer-readable program code is also executable to add a fourth plurality of fence elements to the finite element model of the second disk that extend away from the second plane on a seventh side of the second disk and an eighth side of the second disk about the perimeter of the second disk. The fence elements of the fourth plurality of fence elements are arranged between nodes of the fourth plurality of nodes. The computer-readable program code is also executable to add a beam element that connects to the first disk and the second disk.

BRIEF DESCRIPTION OF THE SEVERAL VIEWS OF THE DRAWINGS

FIG. 5A is a side view of a finite element model according to at least one aspect of three load-bearing plates with four fasteners passing through holes therein, wherein a top load-bearing plate and a bottom load-bearing plate have forces applied in a first direction and a middle load-bearing plate has forces applied in a different direction;

FIG. 5B is a detailed side view of a finite element model of one of the fasteners of FIG. 5A in which the fastener and the holes through which it passes have a clearance fit;

FIG. 5C is a detailed side view of a finite element model of one of the fasteners of FIG. 5A in which the fastener and the holes through which it passes have a neat fit or an interference fit;

DETAILED DESCRIPTION

In the following, reference is made to aspects presented in this disclosure. However, the scope of the present disclosure is not limited to specific described aspects. Instead, any combination of the following features and elements, whether related to different aspects or not, is contemplated to implement and practice contemplated aspects. Furthermore, although aspects disclosed herein may achieve advantages over other possible solutions or over the prior art, whether or not a particular advantage is achieved by a given aspect is not limiting of the scope of the present disclosure. Thus, the following aspects, features, and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Finite element models can be used to analyze local mechanical behavior of a part of a machine or structure. For example, a finite element model can be used to predict stresses, strains, and the like in a part of a machine or structure. In a finite element model, a part is divided into several elements, and the elements are connected to each other at nodes. The elements and nodes result in a set of simultaneous algebraic equations, which can be solved to determine the forces, stresses, etc. on each element. There may be hundreds or thousands of such equations, so such equations are typically solved by a computer.

Figure 1A:
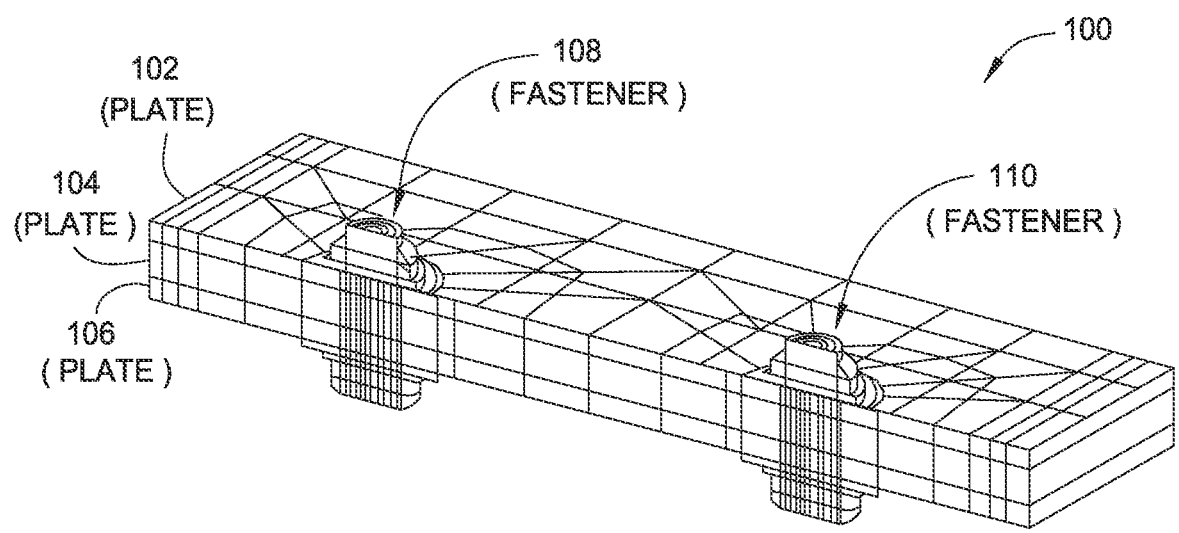
FIG. 1A is a perspective view of a complex finite element model of two fasteners passing through holes in three load-bearing plates.
Figure 1B:
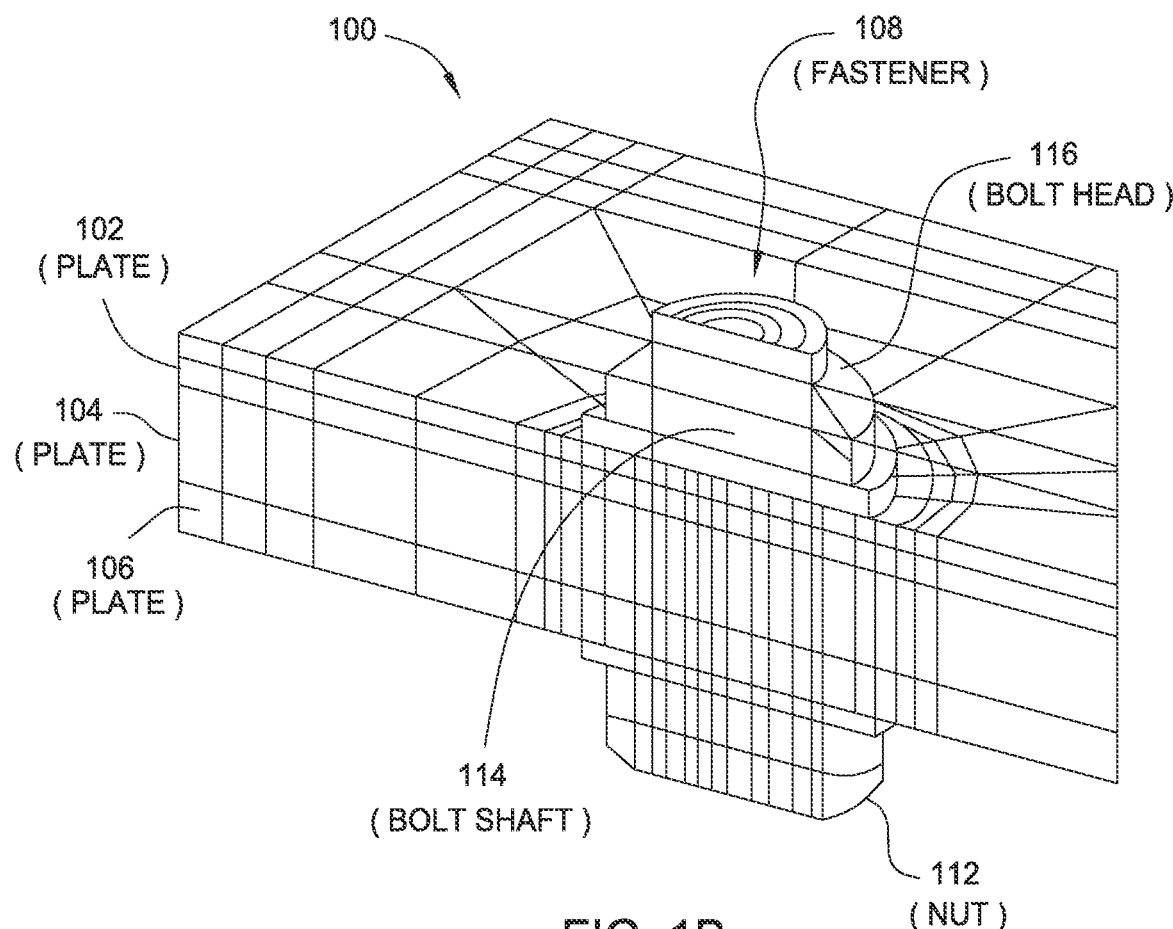
FIG. 1B is a detailed perspective view of the complex finite element model shown in FIG. 1A.
Figures 2A, 2B:
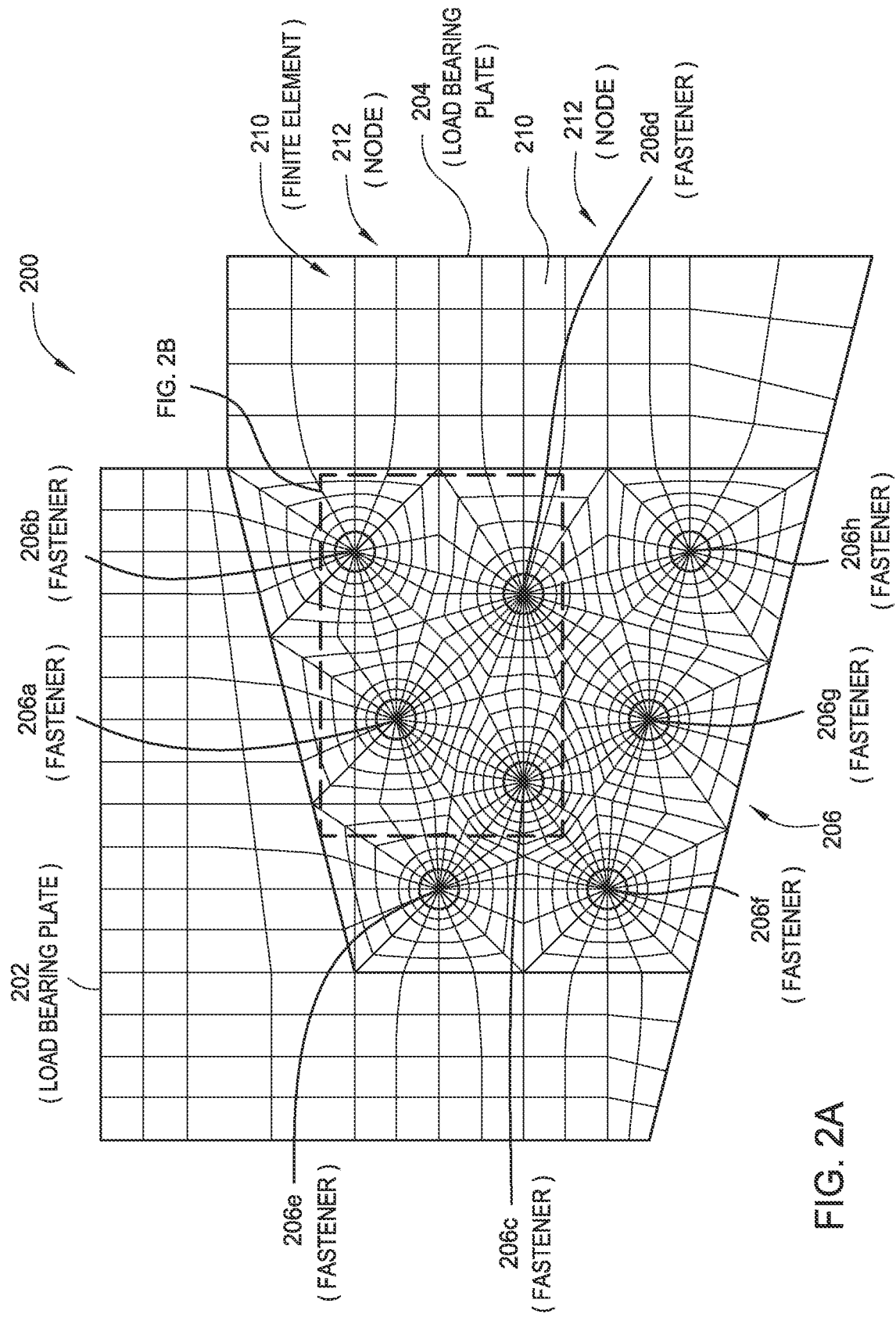
FIG. 2A is a top view of a simplified finite element model of eight fasteners passing through two or more load-bearing plates)
FIG. 2B is a detailed top view of a portion of the simplified finite element model shown in FIG. 2A.
Figure 2B:
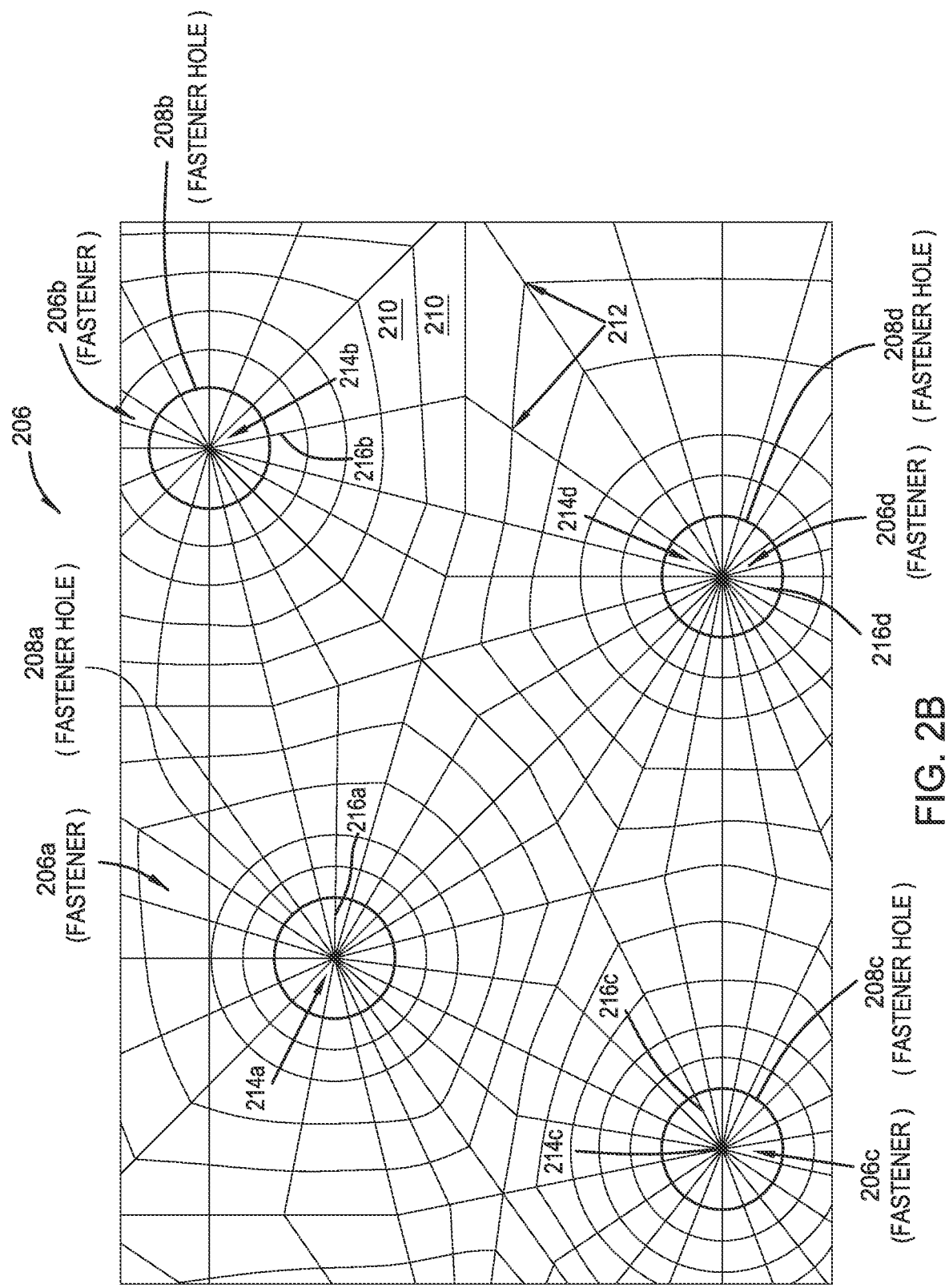

One challenging aspect of finite element modeling is modeling fastener holes, such as a hole in a load-bearing plate through which a bolt, rivet, or the like passes. FIGS. 1A and 1B illustrate a finite element model 100 of portions of three load-bearing plates: a first load-bearing plate 102, a second load-bearing plate 104, and a third load-bearing plate 106. The three load-bearing plates 102, 104, and 106 are stacked on top of one another. A first fastener 108 and a second fastener 110 fasten the three load-bearing plates 102, 104, and 106 together. FIG. 1B provides a more detailed view of the first fastener 108 passing through the load-bearing plates 102, 104, and 106. The fastener 108, a bolt as illustrated, includes a bolt head 116 resting on the first load-bearing plate 102 and attached to a shaft 114. A nut 112 is arranged on the shaft 114 and is resting on the third load-bearing plate 106. As shown in FIG. 1B, the fastener 108 and the hole are modeled in great detail with numerous finite elements. While such detailed finite element modeling of a holes and bolts can provide accurate predictions of forces, stresses, strains, and the like, such modeling is generally impractical for finite element modeling on a large scale. For example, FIG. 2A illustrates multiple load-bearing plates held together by eight bolts. If many bolts and the surrounding holes were modeled in a finite element model in the level of detail shown in FIGS. 1A and 1B, a computer may take hours, days, or longer to solve the simultaneous algebraic equations. Furthermore, such solutions may only be possible on very powerful computers (e.g., supercomputers).

Figure 1C:
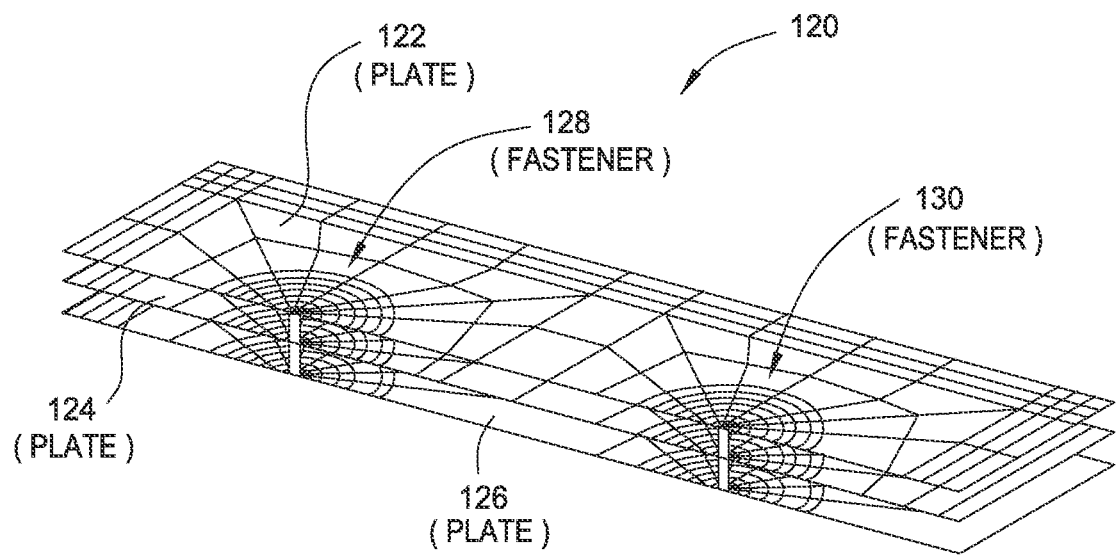
FIG. 1C is a detailed perspective view of a simplified finite element model of two fasteners passing through holes in three load-bearing plates.
Figure 1D:
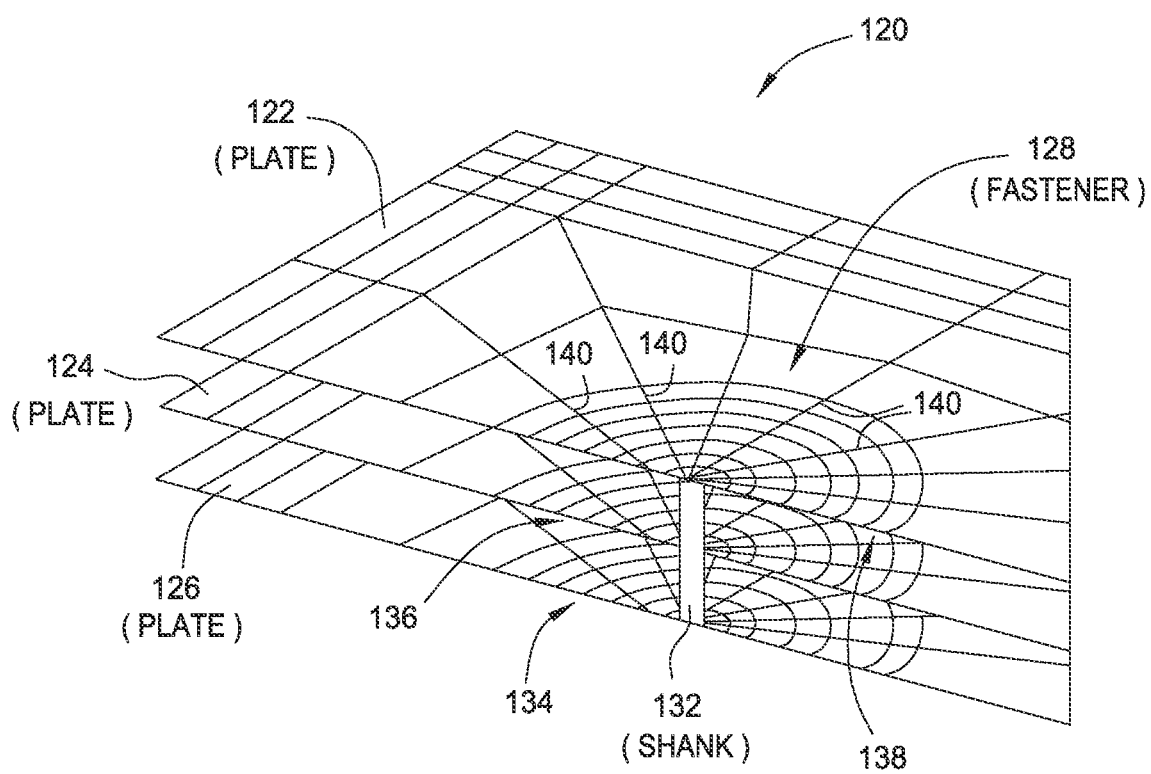
FIG. 1D is a detailed perspective view of a portion of the simplified finite element model shown in FIG. 1C.

FIGS. 1C and 1D and FIGS. 1E and 1F illustrate two simplified finite element models for a fastener through a hole in a load-bearing plate. FIGS. 1C and 1D illustrate a finite element model 120 for a first load-bearing plate 122, a second load-bearing plate 124, and a third load-bearing plate 126 that are held together by fasteners 128 and 130. Referring to FIG. 1D, which shows the portion of the finite element model 120 proximate to the fastener 128, the fastener 128 is modeled as a shank 132. Each load-bearing plate is modeled by a large number of small finite elements that are connected to the shank 132. For example, the first load-bearing plate 122 includes a first arrangement 138 of small finite elements, the second load-bearing plate 124 includes a second arrangement 136 of small finite elements, and the third load-bearing plate 126 includes a third arrangement 134 of small finite elements. The finite element model 120 shown in FIGS. 1C and 1D use significantly fewer numbers of finite elements than the number of finite elements shown of the finite element model 100 shown in FIGS. 1A and 1B. As a result, computer processing time to run the finite element model is significantly reduced.

Figure 1E:
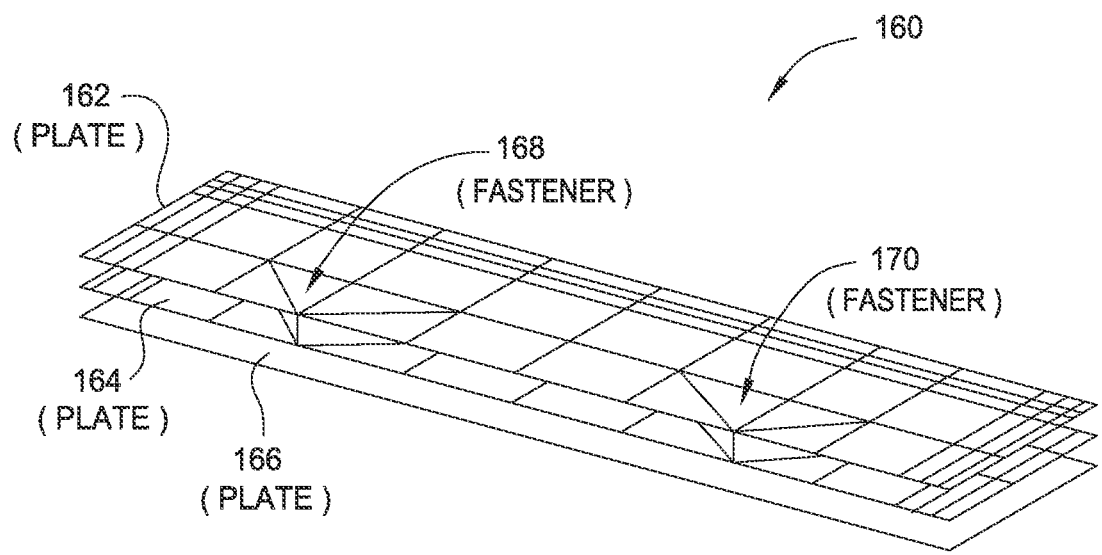
FIG. 1E is a detailed perspective view of another simplified finite element model of two fasteners passing through holes in three load-bearing plates.
Figure 1F:
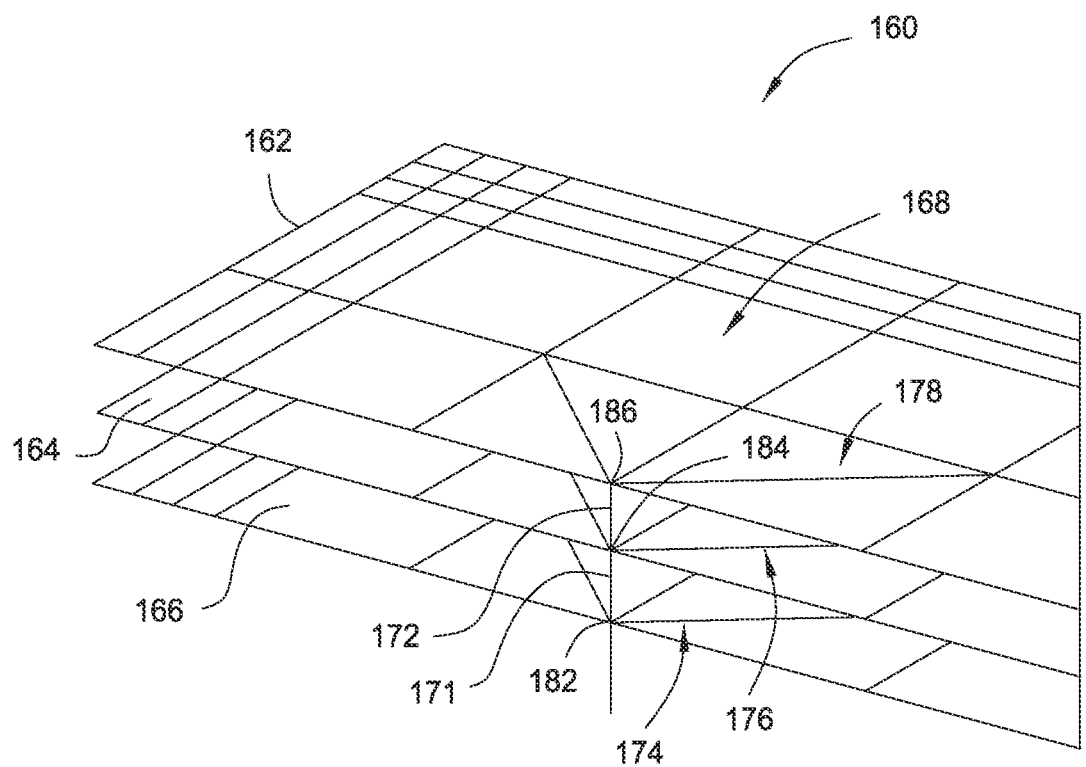
FIG. 1F is a detailed perspective view of a portion of the simplified finite element model shown in FIG. 1E.

FIGS. 1E and 1F illustrate another finite element model 160 for a first load-bearing plate 162, a second load-bearing plate 164, and a third load-bearing plate 166 that are held together by fasteners 168 and 170 through holes therein. Referring to FIG. 1F, which shows the portion of the finite element model 160 proximate to the fastener 168, the fastener 168 is modeled as beam elements 171 and 172. The beam elements are connected to nodes of surrounding finite elements of the load-bearing plate. For example, beam element 171 is connected to node 182 of the third load-bearing plate 166 and node 184 of the second load-bearing plate 164. Similarly, beam element 172 is connected to node 184 of the second load-bearing plate 164 in node 186 of the first load-bearing plate 162. The beam arrangement of the finite element model of FIGS. 1E and 1F use significantly fewer numbers of finite elements than the number of finite elements shown of the finite element model 100 shown in FIGS. 1A and 1B. As a result, computer processing time to run the finite element model is significantly reduced.

FIGS. 2A and 2B illustrate another finite element model 200 that models a first load-bearing plate 202 and a second load-bearing plate 204 that overlap. The load-bearing plates 202 and 204 comprise multiple finite elements 210 and nodes 212 between the finite elements 210. The first load-bearing plate 202 and the second load-bearing plate 204 are connected by eight fasteners 206a-h. Referring specifically to FIG. 2B, the fastener holes 206 are modeled as wagon wheels that include a central node 214 and beam elements 216 extending to edges of the fastener hole 208 (denoted by the thicker lines). For example, fastener 206a is modeled with a central node 214a and a plurality of beam elements 216a radiating radially outward to edges of the hole 208a. Also, fastener 206b is modeled with a central node 214b and a plurality of beam elements 216b radiating radially outward to edges of the hole 208b. Also, fastener 206c is modeled with a central node 214c and a plurality of beam elements 216c radiating radially outward to edges of the hole 208c. Also, fastener 206d is modeled with a central node 214d and a plurality of beam elements 216d radiating radially outward to edges of the hole 208d. The wagon wheel arrangement of the finite element model of FIGS. 2A and 2B use significantly fewer numbers of finite elements than the number of finite elements shown of the finite element model 100 shown in FIGS. 1A and 1B. As a result, computer processing time to run the finite element model is significantly reduced.

The simplified finite element models 120 and 160 shown in FIGS. 1C-1F and finite element model 200 shown in FIGS. 2A and 2B can improve the solution time for analyzing a finite element model (relative to the finite element model 100 shown in FIGS. 1A and 1B). However, the simplified finite element models 120, 160, and 200 can be inaccurate, especially in instances in which the fastener holes are clearance fit holes. Fastener holes generally are either interference fit holes, neat fit holes, or clearance fit holes. In an interference fit hole, a fastener has the same or slightly larger diameter than the hole into which it is being placed, resulting in an interference between the fastener and walls of the hole such that all sides of the fastener are in contact with the hole both at installation and under shear loading. In a neat fit hole, the fastener has a diameter that is essentially the same as the diameter of the hole, resulting in a snug (or neat) fit. Again, all sides of the fastener are in contact with the hole in a neat fit at installation, but may not necessarily be in contact with the hole under shear loading. In a clearance fit hole, a fastener has a smaller diameter than the hole into which it is being placed. As a result, the fastener may not be in contact with the hole at installation, and be in contact with only one side of a hole under shear loading. The simplified finite element models 120, 160, and 200 described above with reference to FIGS. 1C-1F and FIGS. 2A-2B inaccurately model clearance holes in particular because the simplified models assume that the fastener is in contact with and connected to all sides of the hole(s) through which is placed. Referring again to FIG. 1D, the shank element 132 is connected to the load-bearing plates 122, 124, and 126 by radially extending beam members 140 surrounding the shank element 132. Similarly, referring again to FIG. 1F, beam elements 170 and 172, representing the bolt, are attached to the load-bearing plates 162, 164, and 166 by radially extending beam members 178. Also, referring to FIG. 2B, nodes 214 are attached to load-bearing plates 202 and 204 by radially extending beam elements 216. The contact and connection of the fastener on all sides of the hole in the finite element model when the bolt is really only in contact with one side of a hole can result in inaccurate results from the finite element model for neat fit holes and clearance fit holes.

In various aspects described below, a finite element model includes a simplified model for a fastener in a hole that is more accurate than the above-described simplified models while providing acceptable processing speeds for the finite element model. In various aspects, a finite element model includes at least one load-bearing plate with a hole therein. The fastener in the hole is modeled as a disk made up of finite elements. The hole and the disk have fence elements arranged perpendicular to the load-bearing plate and the disk. Contact bodies are attached to the fences. The contact bodies position the disk relative to the hole and transmit contact forces between the finite elements of the load-bearing plate and the finite elements of the disk.

Figure 3A:
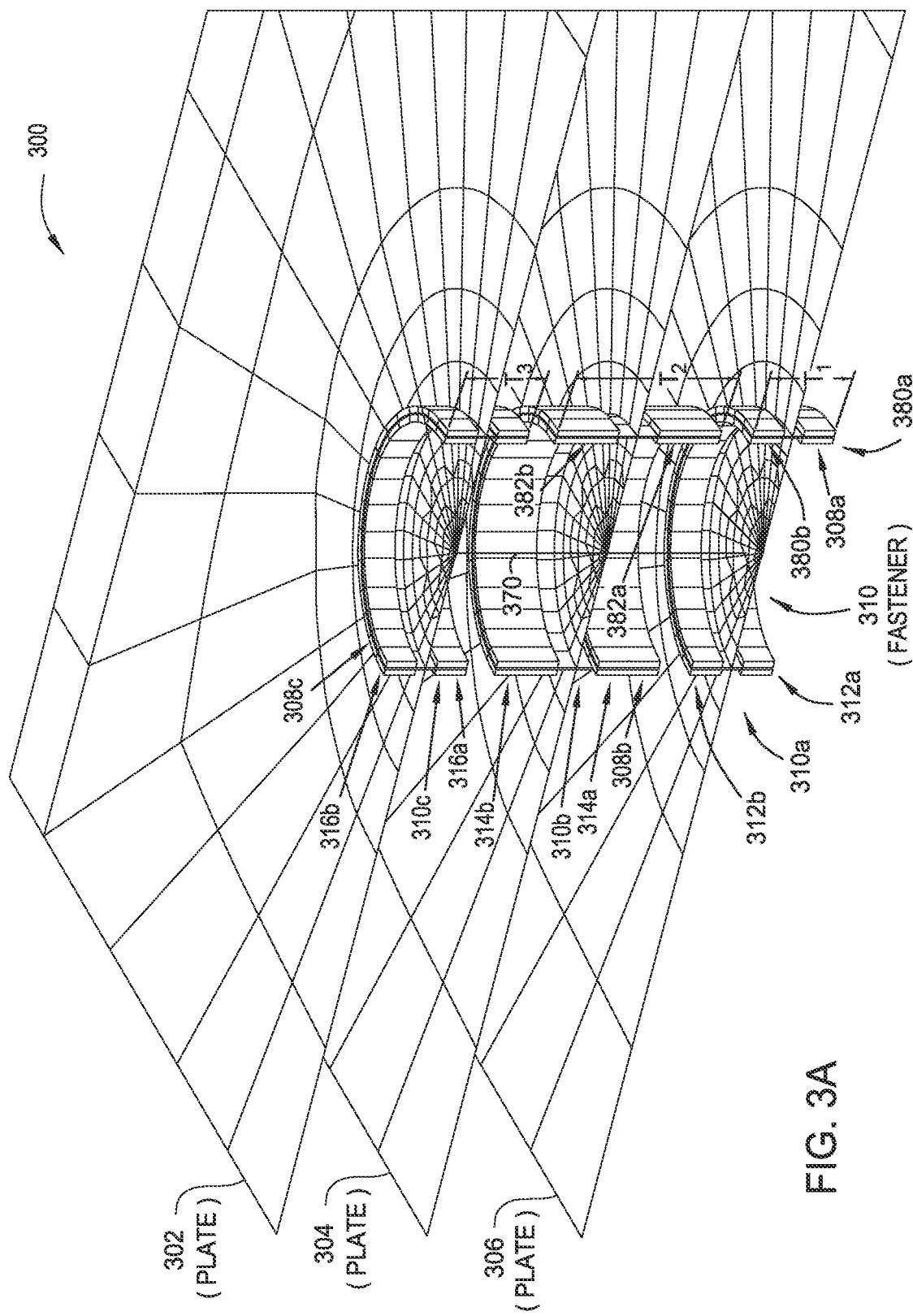
FIG. 3A is a perspective view of a simplified finite element model of a fastener passing through holes in three load-bearing plates according to at least one aspect.
Figure 3B:
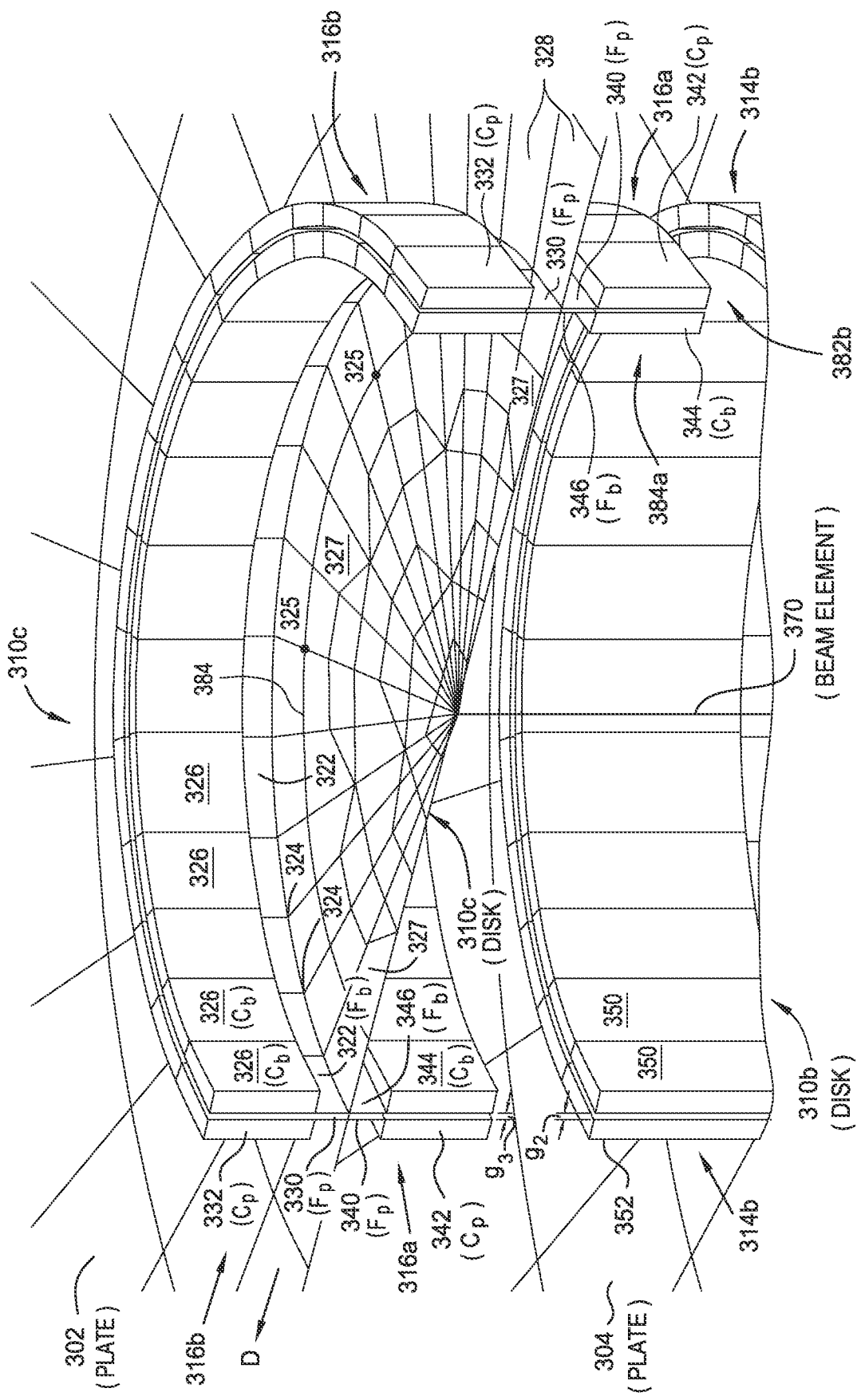
FIG. 3B is a first detailed perspective view of the simplified finite element model shown in FIG. 3A.
Figure 3C:
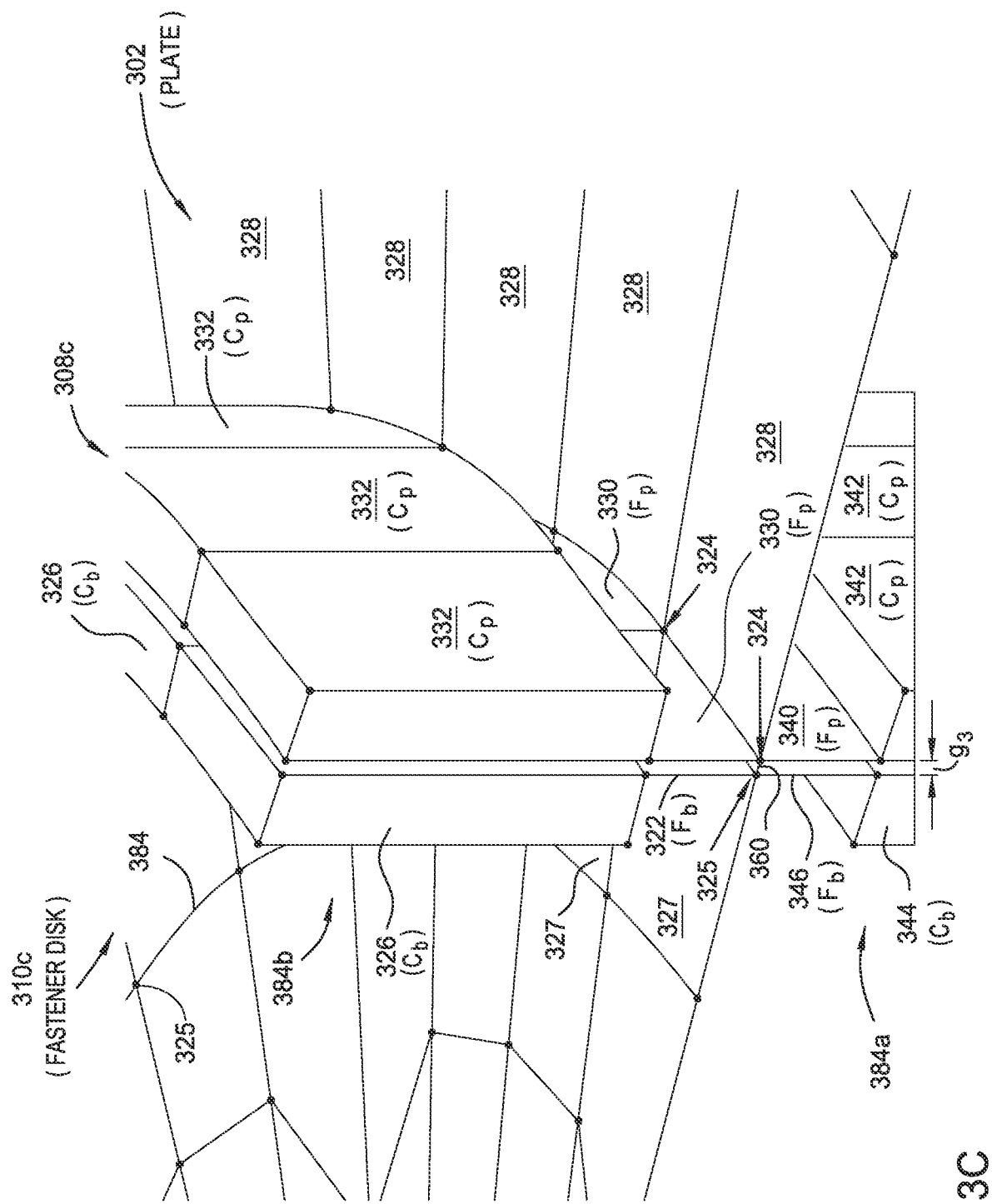
FIG. 3C is a second detailed perspective view of the simplified finite element model shown in FIG. 3A.

FIGS. 3A through 3C illustrate aspects of a finite element model 300 of three load-bearing plates 302, 304, and 306 and a fastener 310 passing through holes therein. Load-bearing plate 302 has fastener hole 308c therein. Load-bearing plate 304 has fastener hole 308b therein. Load-bearing plate 306 has fastener hole 308a therein. Each hole has two sets of fence elements and contact bodies extending away from the load-bearing plate. For example, load-bearing plate 306 has a first set of fence elements and contact bodies 312a extending from the first side of the load-bearing plate 306 and a second set of fence elements and contact bodies 312b extending from a second side of the load-bearing plate 306 opposite the first side. Similarly, load-bearing plate 304 has a first set of fence elements and contact bodies 314a extending from a first side of the load-bearing plate 304 and a second set of fence elements and contact bodies 314b extending from a second side of the load-bearing plate 304 opposite the first side. Also, load-bearing plate 302 has a first set of fence elements and contact bodies 316a extending from the first side of the load-bearing plate 302 and a second set of fence elements and contact bodies 316b extending from a second side of the load-bearing plate 302 opposite the first side.

FIGS. 3B and 3C illustrate a portion of the load-bearing plate 302 around the hole 308 in greater detail. The finite elements of the load-bearing plate 302 lie in a plane. The finite element model of the load-bearing plate 302 includes a plurality of finite elements 328 surrounding a perimeter (e.g., a circumference) of the hole 308c. Nodes 324 are arranged about the perimeter between the finite elements 328. A first set of fence elements (Fp) 330 and a second set of fence elements (Fp) 340 are added to the finite element model of the load-bearing plate 302. The first set of fence elements (Fp) 330 and the second set of fence elements (Fp) 340 are arranged about the perimeter between nodes 324. The first set of fence elements (Fp) 330 extend away from the plane on a first side of the load-bearing plate 302. The second set of fence elements (Fp) 340 extend away from the plane on a second side of the load-bearing plate 302 that is opposite the first side of the load-bearing plate 306. The fence elements (Fp) 330 and (Fp) 340 do not model the actual load-bearing plate 302, but are used to enable the interactions between finite elements of the load-bearing plate 302 and finite elements of a fastener. Thus, the fence elements (Fp) 330 and (Fp) 340 include properties that are not related to actual properties of the load-bearing plate 302. These properties are described below.

Figure 3D:
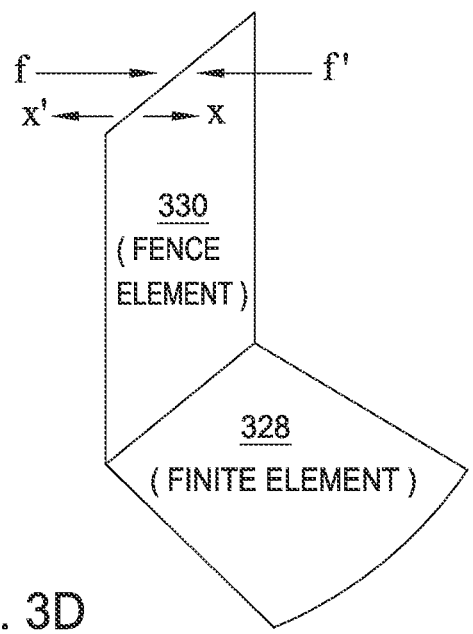
FIG. 3D is a perspective view that illustrates stiffness in a first direction of a fence element in the simplified finite element model shown in FIG. 3A.

In various aspects, the first set of fence elements (Fp) 330 and the second set of fence elements (Fp) 340 are connected to the finite elements 328 of the load-bearing plate 302 using moment connections. The first set of fence elements (Fp) 330 and the second set of fence elements (Fp) 340 are arranged are right angles to the finite elements 328, and the right angle relationship of the fence elements (Fp) 330, (Fp) 340 relative to the finite elements 328 is enforced regardless of forces placed on the finite elements 328 of the load-bearing plate 302 or on the fence elements (Fp) 330, (Fp) 340. The fence elements also have a high degree of bending stiffness in a direction normal to the surface of the load-bearing plate 302. FIG. 3D illustrates a single finite element 328 of the load-bearing plate 302 with a single fence element 320 added to it. As described above, an angle between the finite element 328 and the load-bearing plate 302 is constrained as a right angle, and the right angle is enforced regardless of forces applied to the finite element 328 or the fence element (Fp) 330. Additionally, due to the high degree of stiffness of the fence element (Fp) 330 in the vertical direction, a force (arrow F) applied the fence element (Fp) 330 results in a very small displacement (arrow x) of the free end of the fence element (Fp) 330. Similarly, a force (arrow F') applied to the fence element (Fp) 330 in the opposite direction results in a very small displacement (arrow x') of the free end of the fence element (Fp) 330. This high degree of stiffness ensures that forces transmitted from the fastener, discussed below, are transmitted to the finite element 328.

Figure 3E:
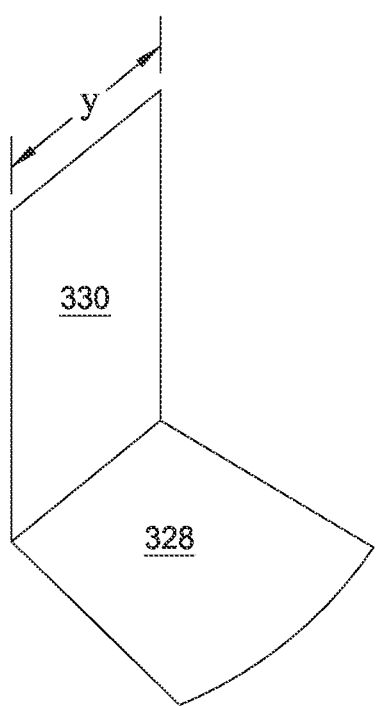
FIG. 3E is a perspective view that illustrates a fence element arranged next to a plate element bordering a hole just before the hole expands radially outward to illustrate lack of stiffness in a circumferential direction.
Figure 3F:
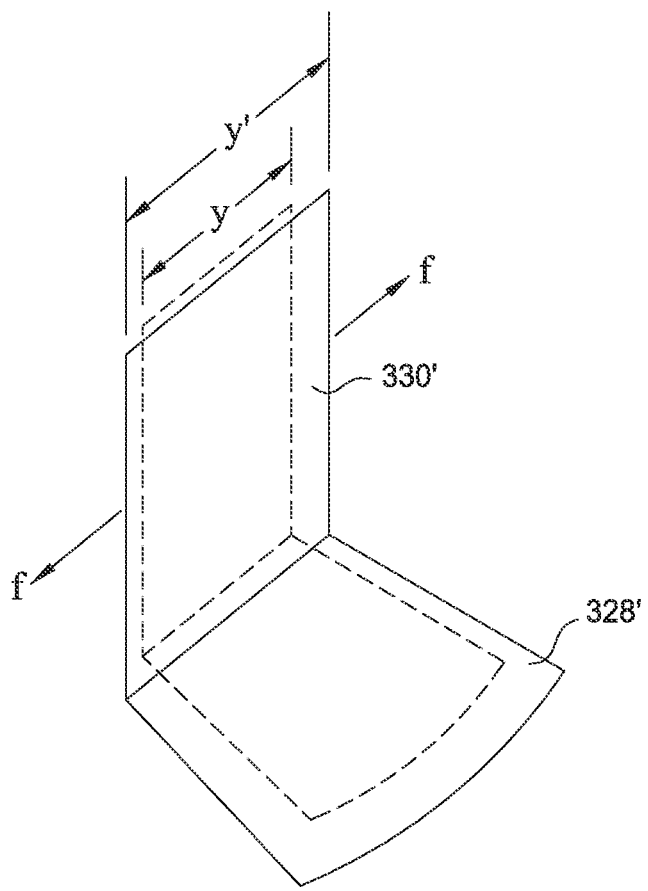
FIG. 3F is a perspective view that illustrates the fence element shown in FIG. 3E after the hole has expanded to illustrate lack of stiffness in a circumferential direction.

The first set of fence elements 320 are connected to each other (e.g., in a hoop around the hole in the load-bearing plate 302) and the second set of fence elements (Fp) 340 are connected to each other. The fence elements have a very low stiffness in a circumferential direction. FIGS. 3E and 3F illustrate this very low circumferential stiffness. FIG. 3E illustrates a fence element (Fp) 330 attached to a plate element 328. The plate element 328 includes a dimension y along the edge of the hole. The fence element (Fp) 330, which is connected to the plate element 328, shares the dimension y. Referring to FIG. 3F, if the hole is expanded (e.g., by an interference fit with a fastener therethrough), then the plate element 328' moves radially outward. As a consequence, the dimension y of the plate element 328' along the edge of the hole increases to y'. The fence element (Fp) 330' must also increase in size to the dimension y'. As used herein, low circumferential stiffness means that a small force fin the circumferential direction is required to cause the fence element (Fp) 330 to change in dimension from y to y'. Put differently, when the plate element 328 is changed to the expanded dimension y', the force from the fence element (Fp) 330 on the plate element 328 that would resist such a change is very small. The fence elements (Fp) 330 and (Fp) 340 have very low stiffness in the circumferential direction because the finite elements 328 of the load-bearing plate 302 and the nodes 324 between them already have properties that define the strength of the hole 308c in the load-bearing plate 302. If the fence elements (Fp) 330 and (Fp) 340 had significant stiffness in the circumferential direction, then the finite element model of the load-bearing plate 302 would artificially increase the strength of the load-bearing plate 302 proximate to the hole 308c therein. The fence elements (Fb) 322 and (Fb) 346 of the fastener include similar low circumferential stiffness.

In various aspects, contact bodies are added to the fence elements. For certain finite element modeling programs, plate-to-plate edge contact is problematic. In addition, plate-to-plate surface contact may also be problematic in this situation. For example, interactions between fence elements on a disk and fence elements on a load-bearing plate may not be modeled correctly, especially in an interference fit hole in which a diameter of fence elements about a disk (modeling a fastener) may be initially larger than a diameter of fence elements about a hole in a load-bearing plate. In such circumstances, finite element modeling programs may not be able to determine that the fence elements are interfering. Defining contact bodies with solid elements that are connected to the fence elements can circumvent such problematic interactions. The solid elements share nodes with the fence elements. Because the fence elements are two-dimensional elements and the contact bodies share nodes with the fence elements, a surface of the contact bodies is in the same two-dimensional plane as the fence elements. In the interference fit hole example above, the fence elements of the disk may start at positions radially outward of fence elements of the hole in the load-bearing plate. However, the contact bodies associated with the solid elements attached to the fence elements will overlap to some degree. The finite element software will recognize that the contact bodies cannot overlap. As a result, the finite element software will cause the finite element program to introduce displacements to the fence elements about the disk and about the hole of the load-bearing plate. As the finite element solver iterates the solution, the fence elements will also end up on the correct sides of one another. The solid elements associated with the contact bodies have very low material stiffness (i.e., a very low modulus of elasticity). As a result, the structure of the contact bodies does not meaningfully affect the finite element model because of the low stiffness of the solid elements. In the aspect shown in FIGS. 3A-3C, the first set of fence elements (Fp) 330 for the plate 302 has a first set of solid elements (Cp) 332 attached thereto and the second set of fence elements (Fp) 340 for the plate 302 has a second set of solid elements (Cp) 342 attached thereto. Like the fence elements (Fp) 330 and (Fp) 340, the solid elements (Cp) 332 and (Cp) 342 do not model the actual load-bearing plate 302, but are used to enable the interactions between finite elements of the load-bearing plate 302 and finite elements of the fastener. Thus, the solid elements (Cp) 332 and (Cp) 342 also include properties that are not related to actual properties of the load-bearing plate 302.

Referring again to FIG. 3A, the fastener 310 is modeled as a series of disks 310a, 310b, and 310c, wherein each disk is substantially aligned with the hole 308 of one of the load-bearing plates. In instances in which the plates 302, 304, and 306 are approximately flat in the region of the hole 308, the finite elements of the plates 302, 304, and 306 can lie in a plane and the disks 310a, 310b, and 310c can be coplanar with the respective plates 302, 304, and 306. In instances in which the plates 302, 304, 306 are not flat (e.g., have curvature to them), the disks 310a, 310b, and 310c can be substantially aligned with the respective plates 302, 304, and 306, meaning that at least a portion of the disks are in line with the respective disks. Put differently, a disk is substantially aligned with a plate if, looking at the elements on edge, the plate and the disk at least partially overlap. In various instances in which the plates include a curvature, the disks could also include curvatures. For example, disk 310a is arranged within hole 308a in load-bearing plate 306, disk 310b is arranged within hole 308b in load-bearing plate 304, and disk 310c is arranged within hole 308c in load-bearing plate 302. The disks 310a-310c are made up of finite elements 327 and nodes 325 between finite elements 327.

The disks 310a-310c are connected to each other by beam or shank elements 370. The beam elements 370 are connected to the disks by moment connections, meaning that the beam elements are orthogonal to the disks where the disks and beam elements meet. The beam elements can have lateral stiffness characteristics defined by the diameter of the fastener and the material properties of the fastener.

In addition to the finite elements 327 and nodes 325, in various aspects, the disks 310a-310c can also include load spreading wagon wheel arrangements of beam elements that extend from the beam elements 370 (i.e., shank elements) to an intermediate radius of the respective bolt disks 310a-c. For example, referring to FIG. 3B the beam elements could extend to a radius denoted by the line 384 at an intermediate radius on the disk 310c and connect to nodes 325 arranged along that line 384. The load spreading wagon wheel can eliminate "slicing" that can otherwise occur due to stress concentrations where the beam element 370 is connected to a relatively fine mesh of finite elements 327. As discussed in greater detail below, the disk models 310a-c can also include stability wagon wheels.

Similar to the load-bearing plates, fence elements and contact bodies are added the finite element models of the disks 310a-310c. For example, referring again to FIG. 3C, the disk 310c includes a first set of fence elements (Fb) 322 extending from a first side of the disk 310c and a second set of fence elements (Fb) 346 extending from a second side of the disk 310c. The fence elements (Fb) 322 and (Fb) 346 can extend away from a plane defined by the disk 310c or, in instances in which the disk 310c is curved, can extend away from a plane defined by the finite elements along the periphery of the disk 310c (e.g., a plane that is parallel to the surface at the edge of the finite elements that define the hole 308c. Alternatively, in instances in which the plate 302 is curved, the fence elements (Fb) 322 and (Fb) 346 along the periphery of the disk 310c can extend in a direction parallel with the beam elements 370 (in FIG. 3A). The fence elements (Fb) 322 and (Fb) 346 are arranged between nodes 325 around an outer periphery of the disk 310c. The fence elements (Fb) 322 and (Fb) 346 are added to the finite elements 327 around edges of the disk 310c. The fence elements (Fb) 322 and (Fb) 346 are connected to the finite elements 327 using moment connections. Like the fence elements (Fp) 330 and (Fp) 340 of the load-bearing plate 302, the fence elements (Fb) 322 and (Fb) 346 of the disk 310c have very high stiffness in the directions normal to the surface of the disk 310c (and the load-bearing plate 302) but very low stiffness in the circumferential direction.

In various aspects, solid elements associated with contact bodies can be added to the fence elements of the disks. For example, the first set of fence elements (Fb) 322 of the disk 310c include solid elements (Cb) 326 and the second set of fence elements (Fb) 346 of the disk 310c include solid elements (Cb) 344. As discussed above, and referring to FIG. 3C, the contact bodies enable a finite element model to understand geospatial positioning of the disks 310 relative to the load-bearing plates 302, 304, 306. In the event the disk 310c, shown in FIG. 3C, is displaced such that the contact bodies associated with the solid elements (Cb) 326 of the disk 310c would overlap with the contact bodies associated with the solid elements (Cp) 332 of the load-bearing plate 302, then the finite element modeling application would know that such an overlap cannot occur and could impose enforced displacements to eliminate such overlap.

Referring again to FIG. 3A, an important aspect of finite element modeling to consider is that load-bearing plates are often modeled using two-dimensional elements. Indeed, load-bearing plates 302, 304, and 306 are illustrated in two dimensions and having no thickness. However, referring to load-bearing plate 302, the finite elements 328 that make up the finite element model of the load-bearing plate 302 have properties that include the thickness of the load-bearing plate 302. Similarly, the finite elements 327 that make up the disk 310c will have properties that include the thickness of the load-bearing plate. As discussed above, the fence elements and contact bodies extend away from the load-bearing plate 302 and the disk 310c. A dimension by which a fence element and contact body extends away from the load-bearing plate or the disk can be equal to half (or slightly less than half) the thickness of the load-bearing plate. For example, FIG. 3A shows that load-bearing plate 306 has a thickness of $T_1$, load-bearing plate 304 has a thickness of $T_2$, and load-bearing plate 302 has a thickness of $T_3$. In the exemplary figure, the thickness $T_2$ of load-bearing plate 304 is thicker than the thicknesses $T_1$ and $T_3$ of load-bearing plates 306 and 302, respectively. As a result, the dimension of the fence elements and contact bodies 314a and 314b of the load-bearing plate 304 and the disk 310b is larger than the dimensions of the fence elements and contact bodies 312a, 312b, 316a, and 316b of the load-bearing plates 302, 306, and disks 310a and 310c, respectively. Such dimensions of the fence elements in contact bodies can provide for an accurate surface interface between surfaces of the holes in the load-bearing plates and the fastener passing therethrough.

In various aspects, the dimensions of the fence elements and contact bodies, described above, can be adjusted to improve the accuracy of the finite element model. For example, a single fastener passing through holes in load-bearing plates may be modeled in detail in a finite element model (similar to the finite element model shown in FIGS. 1A and 1B). If such a detailed model results in different stresses, strains, and the like than the finite element model described above with reference to FIGS. 3A-3C, then the dimensions of the fence elements and contact bodies could be tweaked, even if such tweaks result in dimensions that do not accurately reflect the thicknesses of the load-bearing plates, to improve the accuracy of the model. Additionally, the element properties of the fence elements and/or the contact bodies could be adjusted to better match the results of the finite element model 300 to the finite element model 100 shown in FIGS. 1A and 1B.

Referring again to FIG. 3C, the finite element modeling technique shown in FIGS. 3A-3C can accommodate fasteners in clearance holes, neat fit holes, or interference fit holes. In the event of an interference fit hole, the finite element model can use the contact bodies to identify exterior surfaces of the load-bearing plates and the fastener and can introduce any displacements or compatibility conditions so that the contact bodies on the finite element model of the fastener do not overlap and are within the contact bodies of the finite element model of the load-bearing plates. For a neat fit hole, the contact bodies of the disk can make slight contact with the contact the contact bodies of the load-bearing plate. For a clearance hole, a gap can exist between the contact bodies of disks and the contact bodies of the load-bearing plates. Referring again to FIG. 3C, a clearance hole may have a dimension that is slightly larger than a fastener therein, resulting in an annular gap. FIG. 3C illustrates such a gap $g_3$ between the load-bearing plate 302 and the disk 310c of the fastener. For a clearance hole, it may be advantageous to include a set of stability elements arranged as a stability wagon wheel between edges of the finite element model for the disk and the finite element model for the load-bearing plate. For example, FIG. 3C shows a stability element 360 (e.g., a beam element) of a stability wagon wheel that connects a node 325 of the disk 310c to a node 324 of the load-bearing plate 302. Additional stability elements can be arranged between the disk 310c and the load-bearing plate 302 around the annular gap. In various aspects, the stability beam elements 360 can be arranged as a stability wagon wheel of beam elements extending from the beam element 370 at the center of the disks 310a-c to the nodes 324 along the edge of the hole in the plate 302. In various aspects, the stability elements of the stability wagon wheel have almost negligible structural properties, meaning they offer almost no resistance to any forces applied to them. However, the stability elements of the stability wagon wheel can position the disks of the fastener 310 in place relative to the load-bearing plates 302, 304, 306 when a finite element model is initiated.

Figure 4:
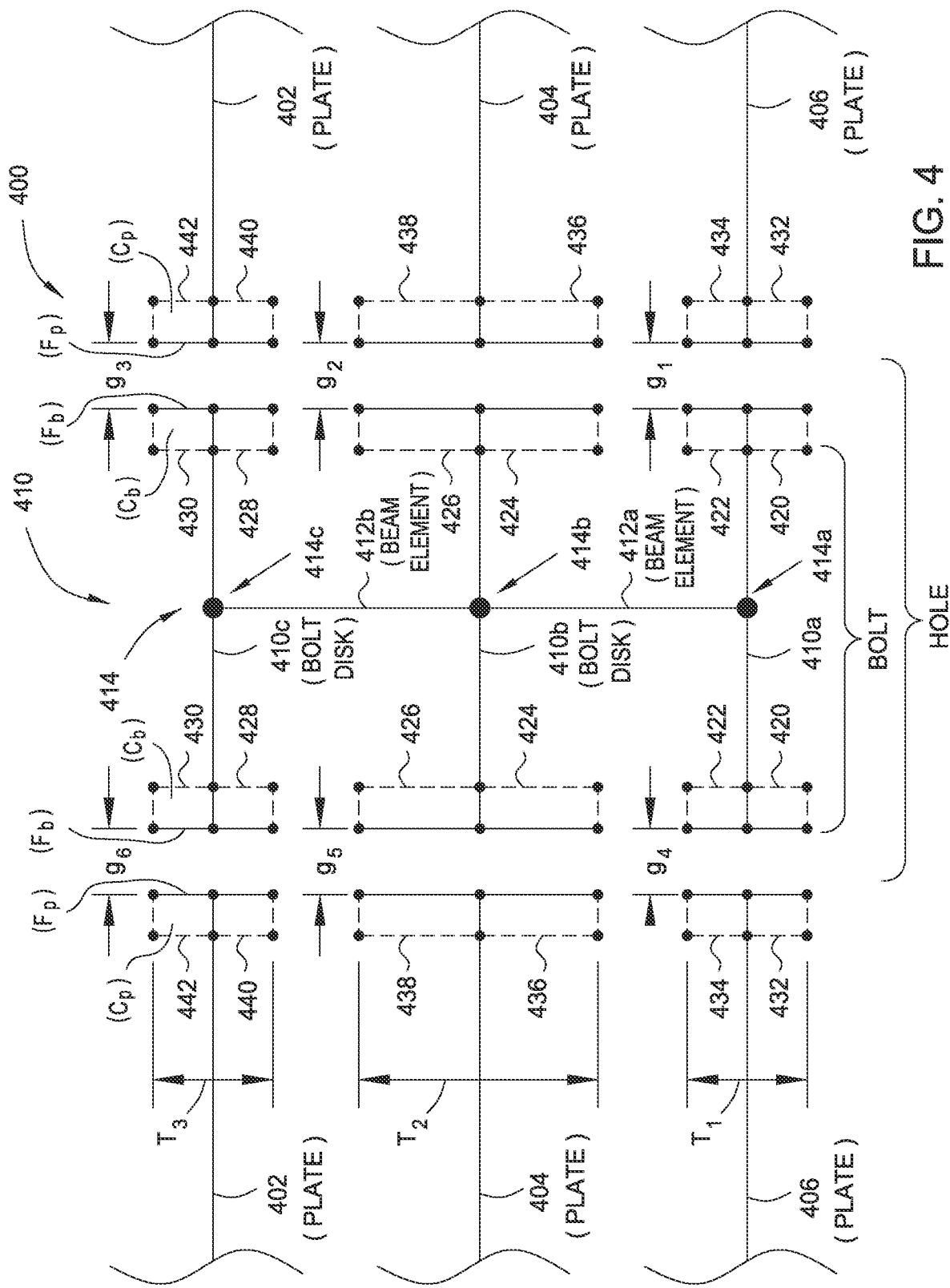
FIG. 4 is a side view of a simplified finite element model according to at least one aspect of a fastener passing through holes in three load-bearing plates according to at least one aspect.

FIG. 4 is a side view of a finite element model 400 using the above-described finite element model arrangement of FIGS. 3A-3C in which a fastener 410 passes through clearance holes in three load-bearing plates 402, 404, 406. The finite element model of the fastener 410 includes three disks 410a, 410b, and 410c which are aligned with load-bearing plates 406, 404, 402, respectively. The load-bearing plates 402, 404, 406 and the disks 410a, 410b, and 410c include fence elements and contact bodies opposing one another. For example, load-bearing plate 406 has a first set of fence elements and contact bodies 432 extending from a first side of the load-bearing plate 406 and a second set of fence elements and contact bodies 434 extending from a second side of the load-bearing plate 406 that is opposite the first side. Similarly, the disk 410a aligned with the load-bearing plate 406 includes a first set of fence elements and contact bodies 420 extending from a first side of the disk 410a and a second set of fence elements and contact bodies 422 extending from a second side of the disk 410a opposite the first side. As another example, load-bearing plate 404 has a first set of fence elements and contact bodies 436 extending from a first side of the load-bearing plate 404 and a second set of fence elements and contact bodies 438 extending from a second side of the load-bearing plate 404 opposite the first side. Similarly, the disk 410b aligned with the load-bearing plate 404 includes a first set of fence elements and contact bodies 424 extending from a first side of the disk 410b and a second set of fence elements and contact bodies 426 extending from a second side of the disk 410b opposite the first side of the disk 410b. As another example, load-bearing plate 402 has a first set of fence elements and contact bodies 440 extending from a first side of the load-bearing plate 402 and a second set of fence elements and contact bodies 442 extending from a second side of the load-bearing plate 402 opposite the first side. Similarly, the disk 410c aligned with the load-bearing plate 402 includes a first set of fence elements and contact bodies 428 extending from a first side of the disk 410c and a second set of fence elements and contact bodies 430 extending from a second side of the disk 410c opposite the first side of the disk 410c. The finite element models of the disks of the fastener 410 include nodes 414a, 414b, and 414c that are connected to one another by beam elements or shank elements. For example, a first beam element 412a can connect a node 414a of the disk 410a to a node 414b of the disk 410b. A second beam element 412b can connect the node 414b of the disk 410b to a node 414c of the disk 410c.

FIG. 4 illustrates that the fence elements and contact bodies extend away from the load-bearing plates by different amounts, which can be a function of the thickness of the different load-bearing plates. Again, in this example, load-bearing plate 404 is thicker than load-bearing plate 402 or load-bearing plate 406. As a result, a dimension $T_2$ of the fence elements and contact bodies 436 and 438 of the second load-bearing plate 404 is greater than the dimension $T_1$ of the fence elements and contact bodies 432 and 434 of the load-bearing plate 406 or the dimensions $T_3$ of the fence elements and contact bodies 440 and 442 of the load-bearing plate 402.

The fastener 410 is separated from load-bearing plate 406 by a first gap $g_1$, from load-bearing plate 404 by a second gap $g_2$, and from the third load-bearing plate 402 by a third gap $g_3$. In various aspects, the fastener 410 may have a constant diameter and the holes in the load-bearing plates 402, 404, 406 may have the same diameter. As a result, the gaps $g_1$, $g_2$, and $g_3$ are the same. In various other instances, a dimension of the fastener and/or dimensions of the holes may vary such that the gaps $g_1$, $g_2$, and $g_3$ vary. In the event of a neat fit, the gaps $g_1$, $g_2$, and $g_3$ may be zero. In the event of an interference fit, the gaps $g_1$, $g_2$, and $g_3$ may be less than zero when the model is initiated. In other situations, the center of the holes in plates 402, 404, and/or 406 may be mislocated, which can result in gaps $g_1$ and $g_4$ being different, gaps $g_2$ and $g_5$ being different, and/or gaps $g_3$ and $g_6$ being different.

FIGS. 5A-5C illustrate contact between fasteners and load-bearing plates for a clearance hole (in FIG. 5B) and in a neat fit hole or an interference fit hole (in FIG. 5C). FIG. 5A shows a side view of a finite element model of three load-bearing plates 502P, 504P, 506P with four holes and fasteners there through. The holes and fasteners are modeled according to the finite element arrangement described above in FIGS. 3A-3E and FIG. 4. Load-bearing plates 502P and 506P have forces applied in the direction of arrows A and C, respectively. Load-bearing plate 504P has forces applied in the direction of arrow B. Thus, the load-bearing plates 502P, 504P, and 506P are applying a shear load on the fasteners.

FIG. 5A illustrates the displacements, greatly exaggerated, from this shear load, wherein a node 542 of a disk aligned with the middle load-bearing plate 504P is shifted to the right relative to nodes 540 and 544 aligned with the top load-bearing plate 502P and the bottom load-bearing plate 506P, respectively. Referring again to FIG. 3B, a load on the load bearing plate 302 is transmitted to the fastener 310 through the fence elements (and contact bodies). For the purposes of illustration, suppose that the load-bearing plate 302 is being loaded to the left in the direction of arrow D. In-plane loads and/or moment loads on finite elements 328 of the load-bearing plate 302 are transferred to fence elements (Fp) 330 and to fence elements (Fp) 340. The load travels along the fence elements (Fp) 330 and 340 of the plate 302 in directions away from the load-bearing plate 302. Due, in part, to the contact bodies (Cp) 332 and 342 of the plate 302 and the contact bodies (Cb) of the fastener, the load transfers to fence elements 322 (Fb) of the fastener disk 310c. Assuming that one of the load-bearing plates 304 and/or 306 is loaded in a different direction than arrow D, the fence elements (Fp) 330 and 340 and the fence elements (Fb) 330 and 340 contact each other on the right side of the fastener hole. Thus, the load from the fence elements (Fp) 330 and 340 of the plate 302 on the right side of the fastener hole are transferred to the fence elements (Fb) 330 and 340 on the right side of the fastener 310. Specifically, the fence elements (Fp) 330 of the plate 302 transfer loads to fence elements (Fb) 322 of the fastener 310 and the fence elements (Fp) 340 of the plate 302 transfer loads to fence elements (Fb) 346 of the fastener 310. The transferred load travels along the fence elements (Fb) 322 and 346 in directions toward the disk 310c of the fastener 310. The load is then transferred into the finite elements 327 of the disk 310c as in-plane membrane forces and/or moment loads. The load travels through the disk 310c to the fastener shank, which is modeled as the beam element 370. The beam element 370 distributes the load to adjacent disks modeling other portions of the fastener 310. For example, the beam element 370 transfers load from the disk 310c to the disk 310b. The load transferred to the disk 310b then travels radially outward along the disk, through the fences to the load-bearing plate 304.

Referring now to FIG. 5B, which models a clearance fit hole (i.e., in which the fastener has a smaller diameter than the hole), the shear load on the fastener 510 forces left-side contact bodies 516a of the load-bearing plate 504P and the disk 510b into contact with each other. By contrast, the right-side contact bodies 516b of the load-bearing plate 504P and disk 510b are not in contact. Furthermore, the shear load on the fastener 510 forces the right-side contact bodies 518b of the load-bearing plate 506P and the disk 510c into contact with each other. Similarly, the shear load on the fastener 510 forces the left-side contact bodies 518a of the load-bearing plate 506P and the disk 510c away from each other. Also, the shear load on the fastener 510 forces the right-side contact bodies 514b of the load-bearing plate 502P and the disk 510a into contact with each other. Similarly, the shear load on the fastener 510 causes the left-side contact bodies 514a of the load-bearing plate 502P and the disk 510c to move away from each other. Shear loads are transmitted from one disk to adjacent disks by beam elements 512a and 512b.

Referring now to FIG. 5C, which models a neat fit hole or an interference fit hole, all of the contact bodies of the respective load-bearing plates and disks are in contact even though the fastener 520 is subjected to the same shear loads as the fastener 510 in FIG. 5B. For example, the left-side contact bodies 524a and the right-side contact bodies 524b of the load-bearing plate 502P and the disk 520a are all in contact. Similarly, the left-side contact bodies 526a and the right-side contact bodies 526b of load-bearing plate 504P and disk 520b are all in contact. Also, the left-side contact bodies 528a and the right-side contact bodies 528b of load-bearing plate 506P and disk 520c are all in contact.

By accurately modeling contact between the load-bearing plates 502P, 504P, and 506P with the fasteners 510 and 520, the finite element models of the holes and fasteners therein can accurately predict stresses (or lack thereof) in the fasteners 510 and 520 and the regions of the load-bearing plates 502P, 504P, 506P proximate to the holes therein as the loading on the plates is increased. This capability to accurately model the gaps provides the capability to determine the relative distribution of shear loads in the fasteners as the load is varied from zero load to a large amount of load.

Figure 6A:
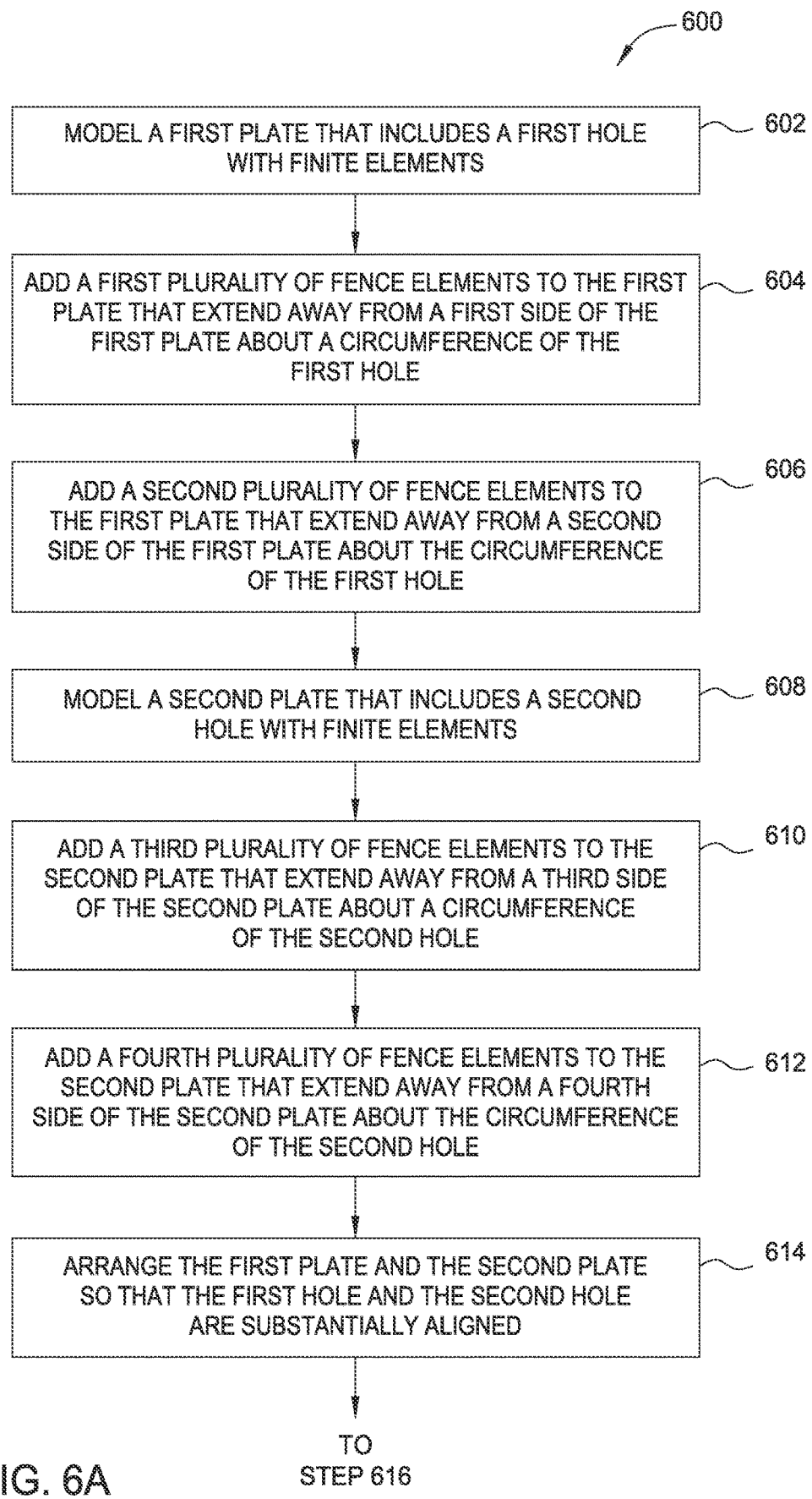
FIGS. 6A and 6B are a block diagram that illustrates a process according to at least one aspect for modeling load-bearing plates and fasteners passing through holes in the load-bearing plates.
Figure 6B:
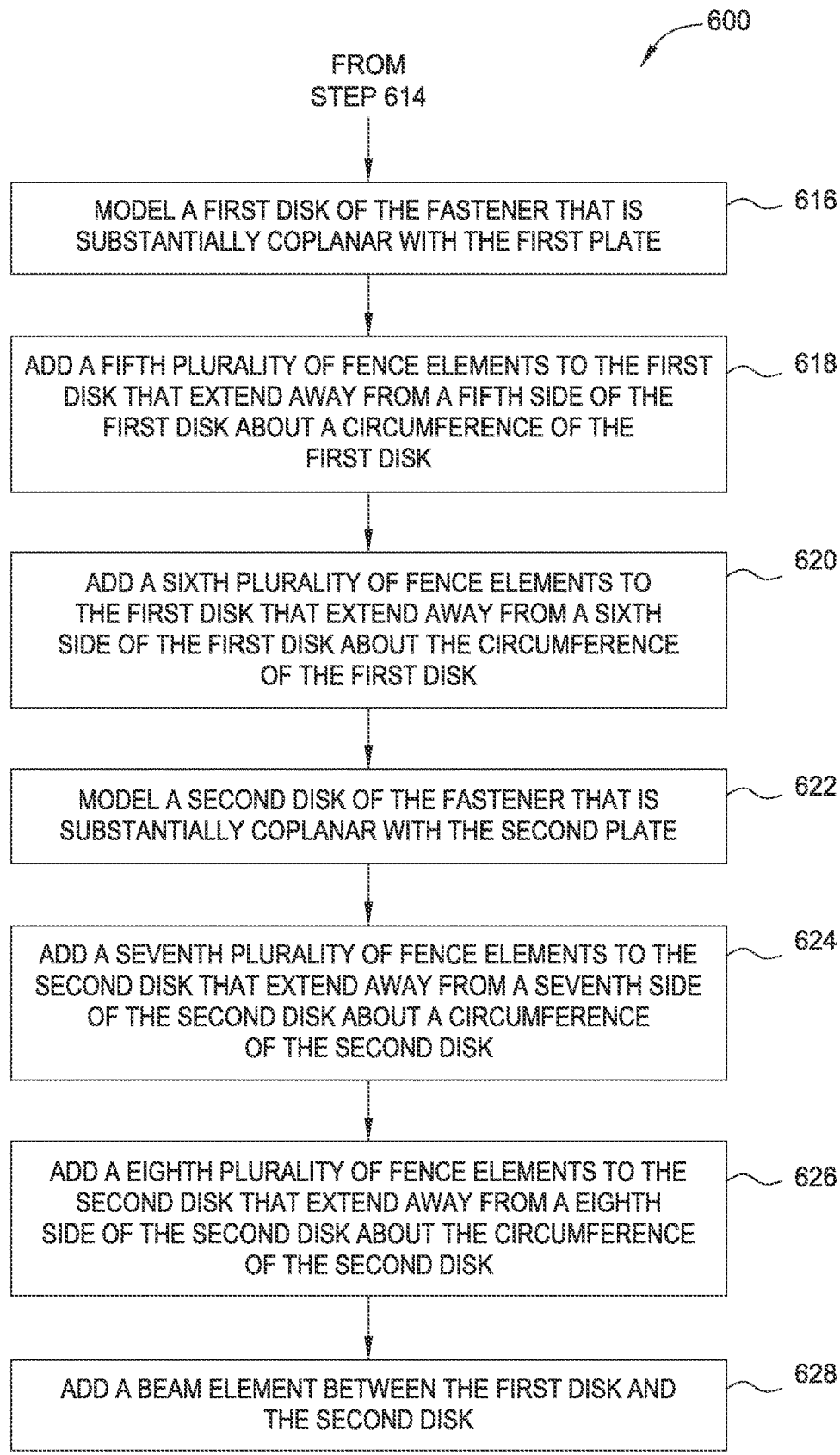

FIGS. 6A and 6B illustrate a method 600 for modeling a fastener passing through holes in load-bearing plates. In block 602, a first load-bearing plate that includes a first hole is modeled with finite elements. The finite element model of the first load-bearing plate can include material properties of the load-bearing plate, the plate thickness, etc. In block 604, a first plurality of fence elements are added to the first load-bearing plate. The first plurality of fence elements extends away from a first side of the first load-bearing plate about a perimeter (e.g., a circumference) of the first hole. In block 606, a second plurality of fence elements are added to the first load-bearing plate. The second plurality of fence elements extends away from a second side of the first load-bearing plate, opposite the first side, about the perimeter of the first hole. In block 608, a second load-bearing plate that includes a second hole is modeled with finite elements. The finite element model of the first load-bearing plate can include material properties of the load-bearing plate, the plate thickness, etc. In block 610, third plurality of fence elements are added to the second load-bearing plate. The third plurality of fence elements extends away from a third side of the second load-bearing plate about a perimeter (e.g., circumference) of the second hole. In block 612, a fourth plurality of fence elements are added to the second load-bearing plate. The fourth plurality of fence elements extends away from a fourth side of the second load-bearing plate, opposite the third side, about the perimeter of the second hole. In block 614, the first load-bearing plate and the second load-bearing plate are arranged so that the first hole and the second hole are substantially aligned. Put differently, the first load-bearing plate and the second load-bearing plate are overlapped so that the first hole and the second hole are substantially aligned.

Moving to FIG. 6B, in block 616, a finite element model of a first disk, representing the portion of the fastener aligned with the first load-bearing plate, is modeled. The finite element model can include material properties of the fasteners, the diameter of the fastener, a thickness of the portion of the fastener aligned with the first load-bearing plate, etc. In block 618, a fifth plurality of fence elements is added to the first disk that extends away from a fifth side of the first disk about a perimeter (e.g., a circumference) of the first disk. In block 620, a sixth plurality of fence elements is added to the first disk that extends away from a sixth side of the first disk, opposite the fifth side, about the perimeter of the first disk. In block 622, a finite element model of a second disk, representing the portion of the fastener aligned with the second load-bearing plate, is modeled. The finite element model can include material properties of the fasteners, the diameter of the fastener, a thickness of the portion of the fastener aligned with the first load-bearing plate, etc. In block 624, a seventh plurality of fence elements is added to the second disk that extends away from a seventh side of the second disk about a perimeter (e.g., a circumference) of the second disk. In block 626, an eighth plurality of fence elements is added to the second disk that extends away from an eighth side of the second disk, opposite the seventh side, about the perimeter of the second disk. In block 628, a beam element is added between the first disk in the second disk.

The above described algorithm can be readily adapted to include additional load-bearing plates. For example, the algorithm can be expanded to include the three load-bearing plates shown in FIGS. 3A-3C, 4, and 5A-5C.

Figure 7A:
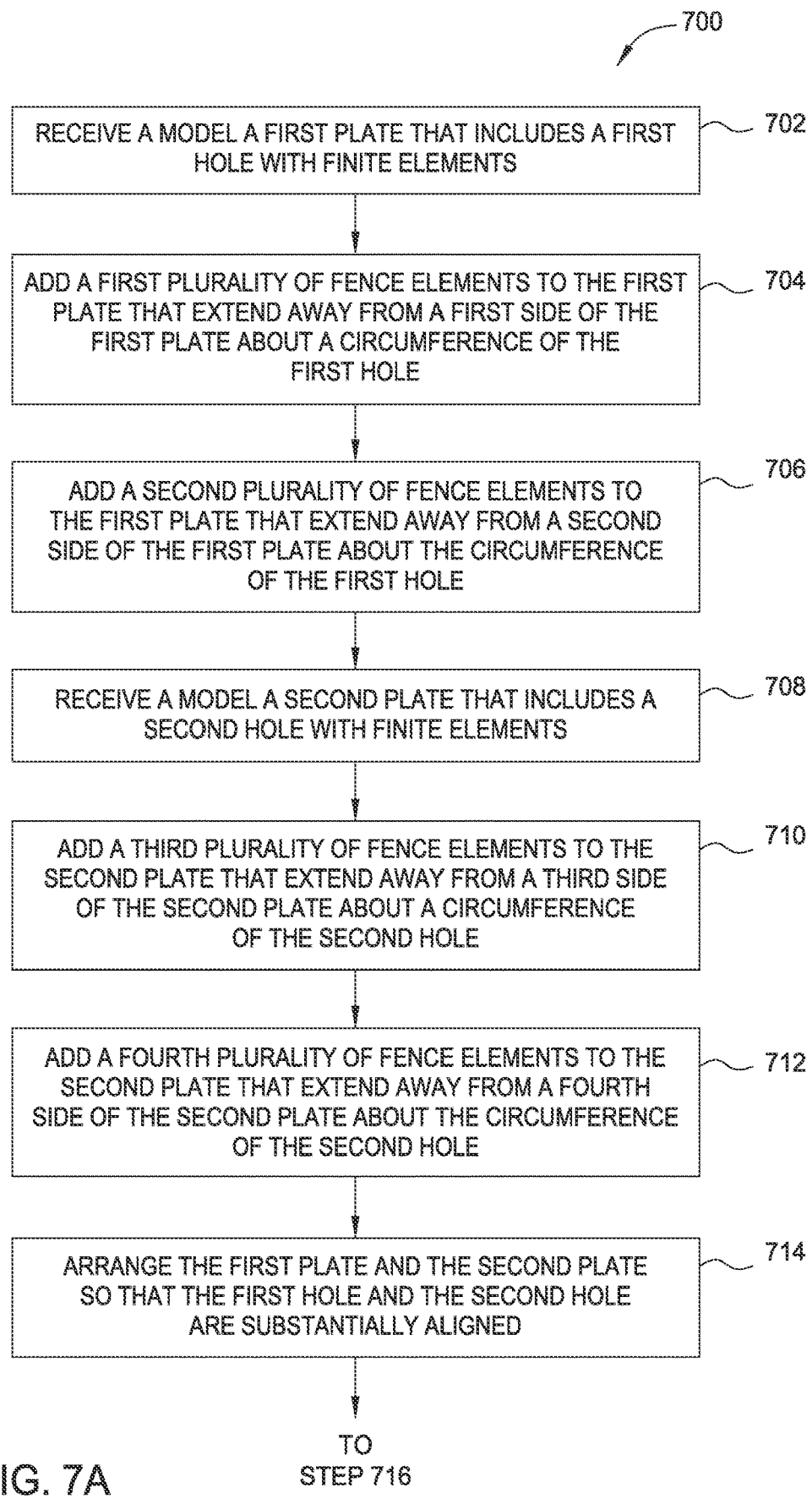
FIGS. 7A and 7B are a block diagram that illustrates a process according to at least one aspect for modeling a fastener to holes in provided finite element models of load-bearing plates.
Figure 7B:
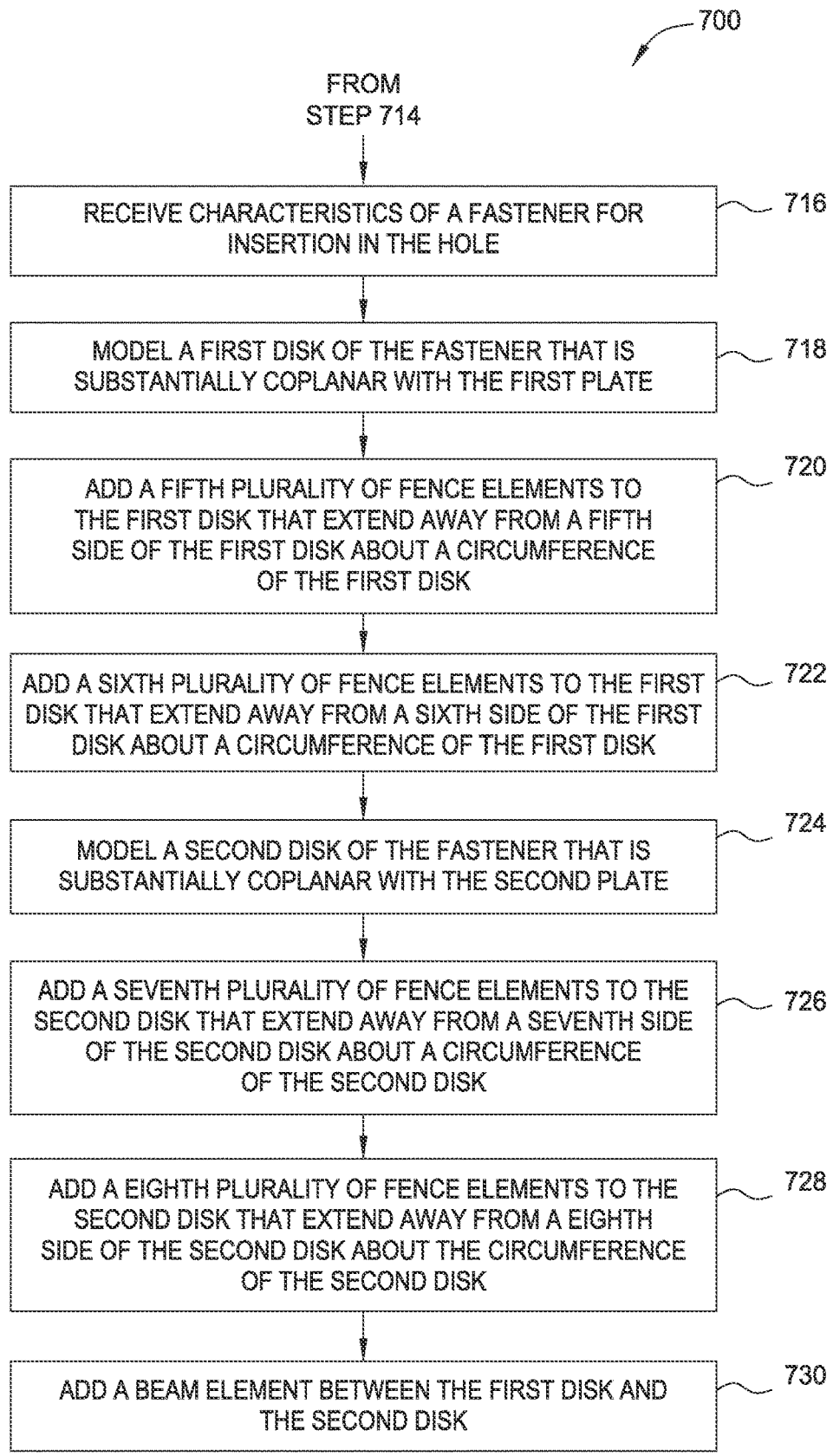

In various aspects, an algorithm for creating a finite element of a fastener passing through holes in load-bearing plates can operate as a macro, function, or the like within a finite element modeling computer program. For example, an operator may selectively run a macro that adds disks, fence elements, and contact bodies to holes to simulate fasteners in the holes. FIGS. 7A and 7B illustrate an algorithm 700 for such a macro, function, or the like (referred to hereinafter as a macro). In block 702, the macro can receive a finite element model of a first load-bearing plate that includes a first hole. The finite element model of the first load-bearing plate can include a thickness of the first load-bearing plate and can identify finite elements that border the first hole. The finite element model of the first load-bearing plate can also include material properties of the first load-bearing plate. In block 704, the macro adds a first plurality of fence elements to the first load-bearing plate. The first plurality of fence elements extends away from a first side of the first load-bearing plate about a perimeter (e.g., a circumference) of the first hole (e.g., the fence elements extend from the finite elements bordering the first hole). In block 706, the macro adds a second plurality of fence elements to the first load-bearing plate. The second plurality of fence elements extends away from a second side of the first load-bearing plate, opposite the first side, about the perimeter of the first hole. In block 708, the macro can receive a finite element model of a second load-bearing plate that includes a second hole. The finite element model of the second load-bearing plate can include a thickness of the second load-bearing plate and can identify finite elements that border the second hole. The finite element model of the second load-bearing plate can also include material properties of the load-bearing plate. In block 710, the macro adds a third plurality of fence elements to the second load-bearing plate. The third plurality of fence elements extends away from a third side of the second load-bearing plate about a perimeter (e.g., a circumference) of the second hole (e.g., the fence elements extend from the finite elements bordering the second hole). In block 712, the macro adds a fourth plurality of fence elements to the second load-bearing plate. The fourth plurality of fence elements extends away from a fourth side of the second load-bearing plate, opposite the third side, about the perimeter of the second hole. In various aspects, the finite element modeling program may have already aligned the first load-bearing plate and the second load-bearing plate so that the first hole and the second hole are aligned. In various other aspects, in block 714, the first load-bearing plate and the second load-bearing plate are arranged so that the first hole and the second hole are substantially aligned. Put differently, the first load-bearing plate and the second load-bearing plate are overlapped so that the first hole and the second hole are substantially aligned.

Moving to FIG. 7B, in block 716, the macro receives characteristics of a fastener to be inserted into the first and second holes. The characteristics include material properties of the fastener and one or more cross-sectional profiles of the fastener. The cross-sectional profiles can include cross-sectional shapes of the fastener (e.g., circle, oval, or square) and dimensions (e.g., diameter) of the fastener. In various instances, the cross-sectional profile of the fastener could change along its length. In block 718, the macro creates a finite element model of a first disk based on the characteristics of the fastener, representing the portion of the fastener aligned with the first load-bearing plate. A thickness characteristic of the finite elements of the first disk can be equal to the thickness of the first load-bearing plate. In block 720, the macro adds a fifth plurality of fence elements to the first disk that extend away from a fifth side of the first disk about a perimeter (e.g., a circumference) of the first disk. In block 722, the macro adds a sixth plurality of fence elements to the first disk that extend away from a sixth side of the first disk, opposite the fifth side, about the perimeter of the first disk. In block 724, the macro creates a finite element model of a second disk based on the characteristics of the fastener, representing the portion of the fastener aligned with the second load-bearing plate. A thickness characteristic of the finite elements of the second disk can be equal to the thickness of the second load-bearing plate. In block 726, the macro adds a seventh plurality of fence elements to the second disk that extend away from a seventh side of the second disk about a perimeter (e.g., a circumference) of the second disk. In block 728, the macro adds an eighth plurality of fence elements to the second disk that extend away from an eighth side of the second disk, opposite the seventh side, about the perimeter of the second disk. In block 730, the macro adds a beam element between the first disk and the second disk.

The above described macro can be readily adapted to include additional load-bearing plates. For example, the macro can be expanded to include the three load-bearing plates shown in FIGS. 3A-3C, 4, and 5A-5C.

As discussed above, for certain finite element modeling programs, plate-to-plate edge contact is problematic. For example, interactions between fence elements on a disk and fence elements on a load-bearing plate may not be modeled correctly. Solid elements associated with contact bodies can be added to the fence elements to circumvent such problematic interactions. The solid elements can have very low material stiffness (i.e., low modulus of elasticity). When a contact body of a disk contacts a contact body of a load-bearing plate, the finite element software will not let the solid bodies penetrate each other. However, the structure of the contact bodies does not meaningfully affect the finite element model because of the low material stiffness of the contact bodies.

Figure 8:
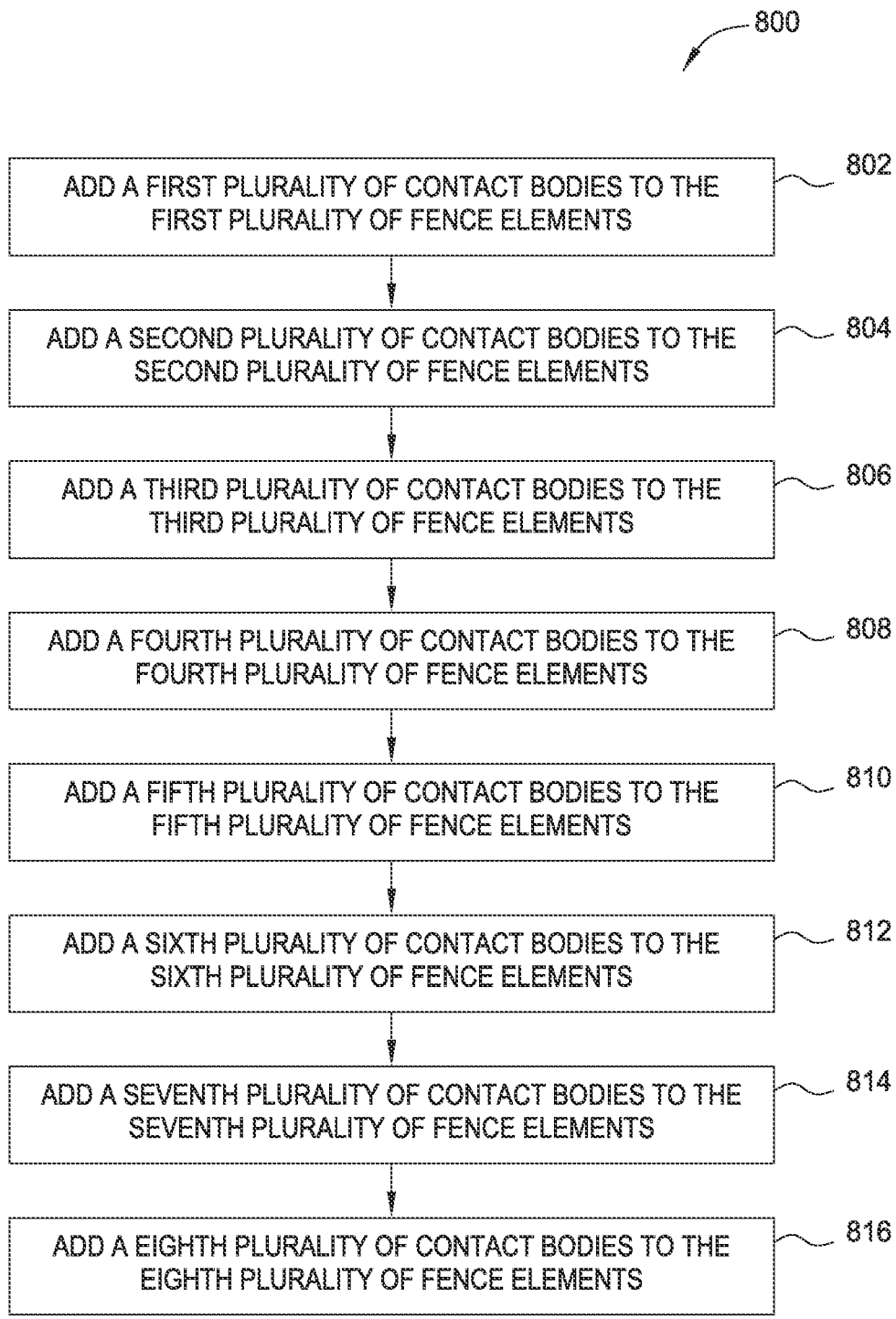
FIG. 8 is a block diagram that illustrates a process for adding contact bodies to fence elements according to at least one aspect.

In the event the particular finite element modeling software being used will benefit from the inclusion of contact bodies on the fence element, FIG. 8 illustrates a method or algorithm 800 that can be used after or in combination with the method 600 shown in FIGS. 6A and 6B. The method or algorithm can also be used by the macro after or in combination with the algorithm 700 shown in FIGS. 7A and 7B. In block 802, a first plurality of contact bodies can be added to the first plurality of fence elements. In block 804, a second plurality of contact bodies can be added to the second plurality of fence elements. In block 806, a third plurality of contact bodies can be added to the third plurality of fence elements. In block 808, a fourth plurality of contact bodies can be added to the fourth plurality of fence elements. In block 810, a fifth plurality of contact bodies can be added to the fifth plurality of fence elements. In block 812, a sixth plurality of contact bodies can be added to the sixth plurality of fence elements. In block 814, a seventh plurality of contact bodies can be added to the seventh plurality of fence elements. In block 816, an eighth plurality of contact bodies can be added to the eighth plurality of fence elements.

After a finite element model has been built that includes the disks, fence elements, and contact bodies (when necessary), described above, the finite element model can be analyzed. At the beginning of execution of the finite element analysis software, the disks and associated fence elements and contact bodies may be floating relative to the load-bearing plates. The above-described "stability" wagon wheels can orient the disks relative to the load-bearing plates and keep the disks in place until the finite element analysis software applied loads to the load-bearing plates. Additionally, in instances of interference fit holes in which contact bodies are used, the finite element analysis software will apply contact forces to the appropriate finite elements to force the contact bodies to not pass through each other. When the finite element software applies loads to the load-bearing plates, certain fence elements of the disks bear up against respective fence elements of the coplanar load-bearing plates. In clearance fit holes, fence elements on one side of the load-bearing plate and disk may bear up against each other while fence elements on opposite sides may spread apart with no contact. Such a circumstance more-accurately models the interaction of the fastener in a clearance hole than the simplified finite element models shown in FIGS. 1C-1F and FIGS. 2A and 2B. In neat fit holes and interference fit holes, fence elements on all sides of the holes in the load-bearing plates and the disk may bear up against each other. This capability is especially useful when modeling single-lap joints with only two plate layers, which typically experience significant rotations and out-of-plane deflections.

The above-described finite element modeling techniques for holes with fasteners there through results in a simplified model that requires less computation time and power than the model shown in FIGS. 1A and 1B, but provides stress (and other) predictions that are more accurate than the predictions provided by the models shown in FIGS. 1C-1F and FIGS. 2A and 2B.

The descriptions of the various aspects herein have been presented for purposes of illustration, but are not intended to be exhaustive or limited to the aspects disclosed. Many modifications and variations will be apparent to those of ordinary skill in the art without departing from the scope and spirit of the described aspects. The terminology used herein was chosen to best explain the principles of the aspects, the practical application or technical improvement over technologies found in the marketplace, or to enable others of ordinary skill in the art to understand the aspects disclosed herein.

Aspects described herein may take the form of an entirely hardware aspect, an entirely software aspect (including firmware, resident software, micro-code, etc.) or an aspect combining software and hardware aspects that may all generally be referred to herein as a "circuit," "module" or "system."

Aspects described herein may be a system, a method, and/or a computer program product. The computer program product may include a computer readable storage medium (or media) having computer readable program instructions thereon for causing a processor to carry out described aspects.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disk read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations according to various aspects may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects.

Aspects are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to certain aspects, other and further aspects may be devised without departing from the basic scope thereof, and the scope thereof is determined by the claims that follow.

What is claimed is:

1. A finite element analysis system to model contact forces for fastener holes, by generating a finite element model of a bolted joint fastening at least two plates, the finite element analysis system comprising:
   one or more computer processors; and
   a memory containing a program which, when executed by the one or more computer processors, performs an operation comprising:
      generating the finite element model, the finite element model comprising:
         (i) at least two plate models having interior edges defining through holes having colinear hole axes, wherein the at least two plate models represent at least two load-bearing plates, wherein the through holes comprise the fastener holes, the fastener holes including plate fence elements arranged as hollow cylinders concentrically relative to the interior edges and between the at least two plate models, wherein the plate fence elements have a high degree of stiffness in a direction parallel to the hole axes and a low degree of stiffness in a perpendicular direction parallel to the interior edges;
         (ii) a bolted joint model comprising: (A) at least one bolt shank modeled as a beam element with a shank axis; (B) at least two bolt disk models corresponding to the at least two plate models, wherein the bolt disk models model a bearing stiffness of the bolted joint, wherein the bolt disk models include bolt disk elements having exterior edges; and (C) bolt fence elements arranged as hollow cylinders concentrically relative to the exterior edges and between the at least two plate models and the at least two bolt disk models, wherein the bolt fence elements have a high degree of stiffness in a direction parallel to the shank axis and a low degree of stiffness in a perpendicular direction parallel to the exterior edges; and
         (iii) a respective plurality of solid elements added to each set of fence elements selected from the plate fence elements and the bolt fence elements, wherein each solid element associated with a contact body has a limited degree of material stiffness in order to limit a structural impact of the contact body on the finite element model;
      wherein the at least two bolt disk models are attached to ends of the at least one bolt shank, wherein the finite element model specifies whether the bolt shank is in contact with each side of the fastener holes;
      determining interactions between the at least two plate models and the bolted joint model based on a set of properties of the plate fence elements and a set of properties of the bolt fence elements, including enforcing at least one displacement (i) of the plate fence elements about the fastener holes and (ii) of the bolt fence elements about the at least two bolt disk models, to eliminate overlapping of solid elements; and
      causing manufacture of a part based on the finite element model.

2. The finite analysis system of claim 1, wherein the set of properties of the plate fence elements comprise: (i) a thickness of the plate fence elements, (ii) a material of the plate fence elements, and (iii) a strength of the plate fence elements, wherein the set of properties of the bolt fence elements comprise: (i) a thickness of the bolt fence elements, (ii) a material of the bolt fence elements, and (iii) a strength of the bolt fence elements, wherein the fastener holes in the at least two plate models further include contact body elements extending from the plate fence elements in a direction away from the fastener holes; and wherein the bolt disks further include contact body elements extending from the bolt fence elements in a direction toward the shank axis.

3. The finite analysis system of claim 1, wherein the bolt disks further include:
   load spreading wagon wheel bar elements extending outwardly from the shank axis partially toward the exterior edges.

4. The finite analysis system of claim 1, further comprising stability wagon wheel bar elements extending from the at least one bolt shank to the interior edges of at least one of the holes, wherein the stability wagon wheel bar elements orient the disk models relative to the plate models and keep the disk models in place until a load is applied to the plates by the finite element analysis system.

5. A finite element analysis system to model contact forces for fastener holes, by generating a finite element model of a bolted joint fastening at least three plates, the finite element analysis system comprising:
   one or more computer processors; and
   a memory containing a program which, when executed by the one or more computer processors, performs an operation comprising:
      generating the finite element model, the finite element model comprising:
         (i) at least three plate models having interior edges defining through holes having colinear hole axes, wherein the at least three plate models represent at least three load-bearing plates, wherein the through holes comprise the fastener holes, the fastener holes including plate fence elements arranged as hollow cylinders concentrically relative to the interior edges, wherein the plate fence elements have a high degree of stiffness in a direction parallel to the hole axes and a low degree of stiffness in a perpendicular direction parallel to the interior edges;

(ii) a bolted joint model comprising: (A) at least one bolt shank modeled as a beam element with a shank axis; (B) at least three bolt disk models corresponding to the at least three plate models, wherein the bolt disk models model a bearing stiffness of the bolted joint, wherein the bolt disk models include bolt disk elements having exterior edges; and (C) bolt fence elements arranged as hollow cylinders concentrically relative to the exterior edges, wherein the bolt fence elements have a high degree of stiffness in a direction parallel to the shank axis and a low degree of stiffness in a perpendicular direction parallel to the exterior edges; and (iii) a respective plurality of solid elements added to each set of fence elements selected from the plate fence elements and the bolt fence elements, wherein each solid element associated with a contact body has a limited degree of material stiffness in order to limit a structural impact of the contact body on the finite element model;

wherein the at least three bolt disk models are attached to ends of the at least one bolt shank, wherein the finite element model specifies whether the at least one bolt shank is in contact with each side of the fastener holes;

determining interactions between the at least three plate models and the bolted joint model based on a set of properties of the plate fence elements of the models of the load-bearing plates and based further on a set of properties of the bolt fence elements of the bolt disk models, including enforcing at least one displacement (i) of the plate fence elements about the fastener holes and (ii) of the bolt fence elements about the bolt disk models, to eliminate overlapping of solid elements; and causing manufacture of a part based on the finite element model.

6. The finite analysis system of claim 5, wherein the set of properties of the plate fence elements of the models of the load-bearing plates comprise: (i) a thickness of the plate fence elements of the models of the load-bearing plates, (ii) a material of the plate fence elements of the models of the load-bearing plates, and (iii) a strength of the plate fence elements of the models of the load-bearing plates, wherein the set of properties of the bolt fence elements of the bolted joint comprise: (i) a thickness of the fence elements of the disks of the bolted joint, (ii) a material of the fence elements of the disks of the bolted joint, and (iii) a strength of the fence elements of the disks of the bolted joint, wherein the fastener holes in the at least three plate models further include contact body elements extending from the plate fence elements in a direction away from the fastener holes; and wherein the bolt disks further include contact body elements extending from the bolt fence elements in a direction toward the shank axis.

7. The finite analysis system of claim 5, wherein the bolt disks further include:

load spreading wagon wheel beam elements extending outwardly from the shank axis partially toward the exterior edges.

8. The finite analysis system of claim 5, further comprising stability wagon wheel beam elements extending from the at least one bolt shank to the interior edges of at least one of the fastener holes, wherein the stability wagon wheel beam elements orient the disk models relative to the plate models and keep the disk models in place until a load is applied to the plates by the finite element analysis system.

9. A computer-implemented method to model contact forces for fastener holes, by generating a finite element model by a computer modeling system, comprising:

modeling a first load-bearing plate with a plurality of finite elements, wherein the finite elements of the first load-bearing plate lie in a first plane, wherein the first load-bearing plate includes a first side and a second side opposite the first side, wherein the first load-bearing plate defines a first hole therein;

adding a first plurality of fence elements to the first load-bearing plate that extend away from the first plane on the first side of the load-bearing plate and the second side of the load-bearing plate about a perimeter of the first hole;

modeling a second load-bearing plate with a plurality of finite elements, wherein the finite elements of the second load-bearing plate lie in a second plane, wherein the second load-bearing plate includes a third side and a fourth side opposite the third side, wherein the second load-bearing plate defines a second hole therein, wherein the first and second holes comprise the fastener holes;

adding a second plurality of fence elements to the second load-bearing plate that extend away from the second plane on the third side of the load-bearing plate and the fourth side of the load-bearing plate about a perimeter of the second hole;

modeling a fastener passing through the first and second holes, by:

modeling a first disk of the fastener with a plurality of finite elements that is substantially aligned with the first load-bearing plate, wherein the first disk includes a fifth side and a sixth side opposite the fifth side;

adding a third plurality of fence elements to the model of the first disk that extend away from the first plane on the fifth side of the first disk and the sixth side of the first disk about a perimeter of the first disk;

modeling a second disk of the fastener with a plurality of finite elements that is substantially aligned with the second load-bearing plate, wherein the second disk includes a seventh side and an eighth side opposite the seventh side;

adding a fourth plurality of fence elements to the model of the second disk that extend away from the second plane on the seventh side of the first disk and the eighth side of the first disk about a perimeter of the second disk; and adding a beam element that is connected to the first and the second disk, wherein the finite element model specifies whether the fastener is in contact with each side of the first and second holes;

adding a respective plurality of solid elements to each plurality of fence elements selected from the first and third pluralities of fence elements, wherein each solid element associated with a contact body has a limited degree of material stiffness in order to limit a structural impact of the contact body on the finite element model;

determining interactions between the models of the load-bearing plates and the fastener by operation of one or more computer processors and based on a set of properties of the first and second pluralities of fence elements of the models of the load-bearing plates and based further on a set of properties of the third and fourth pluralities of fence elements of the disks of the fastener, including enforcing at least one displacement (i) of the first plurality of fence elements about the first hole and (ii) of the third plurality of fence elements about the first disk, to eliminate overlapping of solid elements; and causing manufacture of a part based on the finite element model.

10. The computer-implemented method of claim 9, wherein the determined interactions include contact forces between the bolted joint and edges of the fastener holes, wherein the fastener holes are selected from interference fit holes, snug fit holes, and clearance fit holes, wherein modeling the fastener in the form of the first and second disks, the third and fourth pluralities of fence elements, and the beam element increases a measure of accuracy of modeling the contact forces at least relative to: (i) when the beam element of the fastener is modeled as being in contact with each side of the fastener holes; and (ii) when the fastener holes are modeled as wagon wheels in a manner that does not account for the beam element of the fastener being only in partial contact with the fastener holes when the first and second load-bearing plates are under shear loading; wherein the fastener comprises a bolted joint.

11. The computer-implemented method of claim 10, wherein the set of properties of the fence elements of the models of the load-bearing plates comprise: (i) a thickness of the fence elements of the models of the load-bearing plates, (ii) a material of the fence elements of the models of the load-bearing plates, and (iii) a strength of the fence elements of the models of the load-bearing plates;

wherein the set of properties of the plurality of fence elements of the disks of the fastener comprise: (i) a thickness of the fence elements of the disks of the fastener, (ii) a material of the fence elements of the disks of the fastener, and (iii) a strength of the fence elements of the disks of the fastener, wherein the plurality of solid elements added to the first plurality of fence elements comprises a first plurality of solid elements, wherein the computer-implemented method further comprises:

adding a second plurality of solid elements to the second plurality of fence elements, wherein the plurality of solid elements added to the third plurality of fence elements comprises a third plurality of solid elements; and adding a fourth plurality of solid elements to the fourth plurality of fence elements.

12. The computer-implemented method of claim 11, wherein the fence elements are connected to the respective load-bearing plates and disks by moment connections, wherein the fence elements have high stiffness in a direction normal to the respective load-bearing plates and disks, wherein the fence elements have very low stiffness in a direction along the perimeter, wherein the computer-implemented method further comprises:

adding a first plurality of stability elements arranged around the perimeter of the first disk, wherein the first plurality of stability elements connect the first disk to the first hole; and adding a second plurality of stability elements arranged around the perimeter of the second disk, wherein the second plurality of stability elements connect the second disk to the second hole.

13. The computer-implemented method of claim 12, wherein modeling the first disk comprises modeling finite elements as a load spreading wagon wheel extending from the beam element, wherein modeling the second disk comprises modeling finite elements as a second load spreading wagon wheel extending from the beam element, wherein the computer-implemented method further comprises:

applying a first load to the first load-bearing plate in a first direction; and applying a second load to the second load-bearing plate in a second direction, wherein the first direction is different than the second direction.

14. The computer-implemented method of claim 13, wherein the computer modeling system comprises a finite element analysis system, wherein the finite element model comprises the modeled first and second load-bearing plates and the modeled fastener, wherein the finite element model further comprises stability wagon wheel bar elements extending from the fastener to interior edges of at least one of the first and second holes, wherein in the finite element model, the stability wagon wheel bar elements orient the first and second disks relative to the first and second load-bearing plates and keep the first and second disks in place until a load is applied to the first and second load-bearing plates by the finite element analysis system.

15. The computer-implemented method of claim 14, further comprising, prior to modeling the fastener, receiving characteristics for the fastener to be inserted through the first and second holes, wherein the received characteristics for the fastener include material properties of the fastener and a cross-sectional profile of the fastener, wherein a respective cross-sectional profile of each of the first and second disks is equal to the cross-sectional profile of the fastener;

wherein modeling the first load-bearing plate includes identifying a first thickness of the first load-bearing plate, wherein modeling the second load-bearing plate includes identifying a second thickness of the second load-bearing plate, wherein a thickness characteristic of the plurality of finite elements of the first disk is equal to the identified first thickness of the first load-bearing plate, wherein a thickness characteristic of the plurality of finite elements of the second disk is equal to the identified second thickness of the second load-bearing plate.

16. A computer program product to model contact forces for fastener holes, by generating a finite element model, the computer program product comprising:

a non-transitory computer-readable medium having computer-readable program code embodied therewith, wherein the computer-readable program code, when executed by one or more computer processors, causes performance of an operation comprising:

modeling a first load-bearing plate with a plurality of finite elements, wherein the finite elements of the first load-bearing plate lie in a first plane, wherein the first load-bearing plate includes a first side and a second side opposite the first side, wherein the first load-bearing plate defines a first hole therein;

adding a first plurality of fence elements to the model of the first load-bearing plate that extend away from the first plane on the first side of the load-bearing plate and the second side of the load-bearing plate about a perimeter of the first hole;

modeling a second load-bearing plate with a plurality of finite elements, wherein the finite elements of the second load-bearing plate lie in a second plane, wherein the second load-bearing plate includes a third side and a fourth side opposite the third side, wherein the second load-bearing plate defines a second hole therein, wherein the first and second holes comprise the fastener holes;

adding a second plurality of fence elements to the model of the second load-bearing plate that extend away from the third side of the load-bearing plate and the fourth side of the load-bearing plate about a perimeter of the second hole;

modeling a fastener passing through the first and second holes, by:

modeling a first disk of the fastener with a plurality of finite elements that is substantially aligned with the first load-bearing plate, wherein the first disk includes a fifth side and a sixth side opposite the fifth side;

adding a third plurality of fence elements to the model of the first disk that extend away from the first plane on the fifth side of the first disk and the sixth side of the first disk about a perimeter of the first disk;

modeling a second disk of the fastener with a plurality of finite elements that is substantially aligned with the second load-bearing plate, wherein the second disk includes a seventh side and an eighth side opposite the seventh side;

adding a fourth plurality of fence elements to the model of the second disk that extend away from the second plane on from the seventh side of the first disk and the eighth side of the first disk about a perimeter of the second disk; and adding a beam element that is connected to the first and the second disk, wherein the finite element model specifies whether the fastener is in contact with each side of the first and second holes;

adding a respective plurality of solid elements to each plurality of fence elements selected from the first and third pluralities of fence elements, wherein each solid element associated with a contact body has a limited degree of material stiffness in order to limit a structural impact of the contact body on the finite element model;

determining interactions between the models of the load-bearing plates and the fastener based on a set of properties of the first and second pluralities of fence elements of the models of the load-bearing plates and based further on a set of properties of the third and fourth pluralities of fence elements of the disks of the fastener, including enforcing at least one displacement (i) of the first plurality of fence elements about the first hole and (ii) of the third plurality of fence elements about the first disk, to eliminate overlapping of solid elements; and causing manufacture of a part based on the finite element model.

17. The computer program product of claim 16, wherein the set of properties of the fence elements of the models of the first and second load-bearing plates comprise: (i) a thickness of the fence elements of the models of the first and second load-bearing plates, (ii) a material of the fence elements of the models of the first and second load-bearing plates, and (iii) a strength of the fence elements of the models of the first and second load-bearing plates, wherein the set of properties of the plurality of fence elements of the disks of the fastener comprise: (i) a thickness of the fence elements of the disks of the fastener, (ii) a material of the fence elements of the disks of the fastener, and (iii) a strength of the fence elements of the disks of the fastener, wherein the plurality of solid elements added to the first plurality of fence elements comprises a first plurality of solid elements, wherein the operation further comprises:

adding a second plurality of solid elements to the second plurality of fence elements, wherein the plurality of solid elements added to the third plurality of fence elements comprises a third plurality of solid elements; and adding a fourth plurality of solid elements to the fourth plurality of fence elements.

18. The computer program product of claim 16, wherein the fence elements are connected to the respective load-bearing plates and disks by moment connections.

19. The computer program product of claim 18, wherein the fence elements have high stiffness in a direction normal to the respective load-bearing plates and disks, and wherein the fence elements have very low stiffness in a direction along the perimeter.

20. The computer program product of claim 16, wherein the operation further comprises:

adding a first plurality of stability elements arranged around the perimeter of the first disk, wherein the first plurality of stability elements connect the first disk to the first hole; and adding a second plurality of stability elements arranged around the perimeter of the second disk, wherein the second plurality of stability elements connect the second disk to the second hole.

21. The computer program product of claim 16, wherein the computer-readable program code models the first disk by modeling finite elements as a load spreading wagon wheel extending from the beam element, and wherein the computer-readable program code models the second disk by modeling finite elements as a second load spreading wagon wheel extending from the beam element.

22. The computer program product of claim 16, wherein the operation further comprises:

applying a first load to the first load-bearing plate in a first direction; and applying a second load to the second load-bearing plate in a second direction, wherein the first direction is different than the second direction.

23. A computer program product to model contact forces for fastener holes, by generating a finite element models, the computer program product comprising:

a non-transitory computer-readable medium having computer-readable program code embodied therewith, wherein the computer-readable program code, when executed by one or more computer processors, causes performance of an operation comprising:

receiving a finite element model of a first load-bearing plate, wherein the finite elements of the first load-bearing plate lie in a first plane, wherein the finite element model of the load-bearing plate defines a first hole that has a first plurality of nodes about a perimeter of the first hole, wherein the finite element model of the load-bearing plate identifies a first thickness of the first load-bearing plate;

receiving a finite element model of a second load-bearing plate, wherein the finite elements of the second load-bearing plate lie in a second plane, wherein the finite element model of the second load-bearing plate defines a second hole that has a second plurality of nodes about a perimeter of the second hole, wherein the finite element model of the second load-bearing plate identifies a second thickness of the second load-bearing plate, wherein the first and second holes comprise the fastener holes;

receiving characteristics for a fastener to be inserted through the first hole in the first load-bearing plate and the second hole in the second load-bearing plate, wherein the received characteristics for the fastener include material properties of the fastener and a cross-sectional profile of the fastener;

adding a first plurality of fence elements to the finite element model of the first load-bearing plate that extend away from the first plane on a first side of the load-bearing plate and a second side of the load-bearing plate about the perimeter of the first hole, wherein the fence elements of the first plurality of fence elements are arranged between nodes of the first plurality of nodes;

adding a second plurality of fence elements to the finite element model of the second load-bearing plate that extend away from the second plane on a third side of the load-bearing plate and a fourth side of the load-bearing plate about the perimeter of the second hole, wherein the fence elements of the second plurality of fence elements are arranged between nodes of the second plurality of nodes;

modeling the fastener inserted through the first and second holes, by:
  generating a finite element model of a first disk within the first hole and in the first plane, wherein a cross-sectional profile of the first disk is equal to the cross-sectional profile of the fastener, wherein a thickness characteristic of finite elements of the first disk is equal to the identified thickness of the first load-bearing plate, wherein the finite element model of the first disk includes a third plurality of nodes about a perimeter of the first disk;
  generating a finite element model of a second disk within the second hole and in the second plane, wherein a cross-sectional profile of the second disk is equal to the cross-sectional profile of the fastener, wherein a thickness characteristic of finite elements of the second disk is equal to the identified thickness of the second load-bearing plate, wherein the finite element model of the second disk includes a fourth plurality of nodes about a perimeter of the second disk;
  adding a third plurality of fence elements to the finite element model of the first disk that extend away from the first plane on a fifth side of the first disk and a sixth side of the first disk about the perimeter of the first disk, wherein the fence elements of the third plurality of fence elements are arranged between nodes of the third plurality of nodes;
  adding a fourth plurality of fence elements to the finite element model of the second disk that extend away from the second plane a seventh side of the second disk and an eighth side of the second disk about the perimeter of the second disk, wherein the fence elements of the fourth plurality of fence elements are arranged between nodes of the fourth plurality of nodes; and
  adding a beam element that is connected to the first disk and the second disk, wherein the finite element model specifies whether the fastener is in contact with each side of the first and second holes;

adding a respective plurality of solid elements to each plurality of fence elements selected from the first and third pluralities of fence elements, wherein each solid element associated with a contact body has a limited degree of material stiffness in order to limit a structural impact of the contact body on the finite element models;

determining interactions between the models of the load-bearing plates and the fastener based on a set of properties of the first and second pluralities of fence elements of the models of the load-bearing plates and based further on a set of properties of the third and fourth pluralities of fence elements of the disks of the fastener, including enforcing at least one displacement (i) of the first plurality of fence elements about the first hole and (ii) of the third plurality of fence elements about the first disk, to eliminate overlapping of solid elements; and causing manufacture of a part based on the finite element model.

24. The computer program product of claim 23, wherein the set of properties of the plate fence elements of the models of the load-bearing plates comprise: (i) a thickness of the plate fence elements of the models of the load-bearing plates, (ii) a material of the plate fence elements of the models of the load-bearing plates, and (iii) a strength of the plate fence elements of the models of the load-bearing plates, wherein the set of properties of the plurality of fence elements of the disks of the fastener comprise: (i) a thickness of the fence elements of the disks of the fastener, (ii) a material of the fence elements of the disks of the fastener, and (iii) a strength of the fence elements of the disks of the fastener, wherein the plurality of solid elements added to the first plurality of fence elements comprises a first plurality of solid elements, wherein the operation further comprises:
  add a second plurality of solid elements to the second plurality of fence elements, wherein the plurality of solid elements added to the third plurality of fence elements comprises a third plurality of solid elements; and
  add a fourth plurality of solid elements to the fourth plurality of fence elements.

25. The computer program product of claim 23, wherein the fence elements are connected to the respective load-bearing plates and disks by moment connections.

26. The computer program product of claim 23, wherein the fence elements have high stiffness in a direction normal to the respective load-bearing plates and disks, and wherein the fence elements have very low stiffness in a direction along the perimeter.

27. The computer program product of claim 23, wherein the operation further comprises:
  adding a first plurality of stability elements arranged around the perimeter of the first disk, wherein the first plurality of stability elements connect the first disk to the first hole; and
  adding a second plurality of stability elements arranged around the perimeter of the second disk, wherein the second plurality of stability elements connect the second disk to the second hole.

28. The computer program product of claim 23, wherein the computer-readable program code models the first disk by modeling finite elements as a load spreading wagon wheel extending from the beam element, and wherein the computer-readable program code models the second disk by modeling finite elements as a second load spreading wagon wheel extending from the beam element.

* * * * *